US012641798B2

(12) United States Patent
Lee et al.

(10) Patent No.: US 12,641,798 B2
(45) Date of Patent: May 26, 2026

(54) MEMORY DEVICE HAVING VARIABLE RESISTANCE MATERIAL AND METHOD OF MANUFACTURING THE SAME

(71) Applicant: Samsung Electronics Co., Ltd., Suwon-si (KR)

(72) Inventors: Jinwoo Lee, Suwon-si (KR); Dongho Ahn, Suwon-si (KR); Donggeon Gu, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 424 days.

(21) Appl. No.: 18/302,415

(22) Filed: Apr. 18, 2023

(65) Prior Publication Data

US 2023/0371285 A1 Nov. 16, 2023

(30) Foreign Application Priority Data

Apr. 20, 2022 (KR) ........................ 10-2022-0049161

(51) Int. Cl.
*H01L 29/06* (2006.01)
*H10B 63/00* (2023.01)

(52) U.S. Cl.
CPC ........... *H10B 63/845* (2023.02); *H10B 63/34* (2023.02)

(58) Field of Classification Search
CPC .... H10B 63/34; H10B 63/84; H10N 70/8265; H10N 70/8833; H10N 70/8836
See application file for complete search history.

(56) References Cited

U.S. PATENT DOCUMENTS

| | | | |
|---|---|---|---|
| 9,059,395 B2 | 6/2015 | Ju et al. | |
| 9,093,369 B2 | 7/2015 | Shin et al. | |
| 11,087,839 B2 | 8/2021 | Yoon et al. | |
| 11,114,504 B1 | 9/2021 | Han | |
| 11,165,018 B2 | 11/2021 | Lee et al. | |
| 2021/0265565 A1 | 8/2021 | Hayakawa et al. | |
| 2022/0093685 A1* | 3/2022 | Kamata | H10B 63/84 |

FOREIGN PATENT DOCUMENTS

KR 10-2021-0100388 A 8/2021

* cited by examiner

*Primary Examiner* — Ismail A Muse
(74) *Attorney, Agent, or Firm* — Harness, Dickey & Pierce, P.L.C.

(57) ABSTRACT

A memory device includes: a gate stack on a substrate, including insulation layers and gate electrodes alternately stacked in a vertical direction, and defining a through hole in the vertical direction; and a pillar structure in the through hole, the pillar structure including: a plurality of channel portions in the through hole to face the gate electrodes and having annular horizontal cross-sections; a plurality of conductive layers in the through hole to face the insulation layers, having annular horizontal cross-sections, and having inner walls protruding toward a center of the through hole with respect to inner walls of the channel portions; and a variable resistance material layer on the inner walls of the channel portions and the inner walls of the conductive layers, in the through hole, and a first portion of the variable resistance material layer overlaps the conductive layers in the vertical direction.

20 Claims, 33 Drawing Sheets

GSH

MGS {
210
120

162B
160B
150B

MGS { 210
      120

GSH    GSH_1

<u>2003</u>

II−II'

MEMORY DEVICE HAVING VARIABLE RESISTANCE MATERIAL AND METHOD OF MANUFACTURING THE SAME

CROSS-REFERENCE TO RELATED APPLICATION

This application is based on and claims priority under 35 U.S.C. § 119 to Korean Patent Application No. 10-2022-0049161, filed on Apr. 20, 2022, in the Korean Intellectual Property Office, the disclosure of which is incorporated by reference herein in its entirety.

BACKGROUND

Inventive concepts relate to a memory device and/or a method of manufacturing the same, and more particularly, to a vertical variable resistance memory device and/or a method of manufacturing the same.

For electronic systems that need data storage, a memory device capable of storing high-capacity data is required or desired. Accordingly, methods for increasing data storage capacity of a memory device are being researched. For example, as a method of increasing the data storage capacity of a memory device, a memory device including 3-dimensionally arranged memory cells instead of 2-dimensionally arranged memory cells has been proposed.

SUMMARY

Inventive concepts provide a vertical variable resistance memory device.

Alternatively or additionally, inventive concepts provides a method of manufacturing the vertical variable resistance memory device.

According some example embodiments, there is provided a memory device including a gate stack on a substrate, the gate stack including a plurality of insulation layers and a plurality of gate electrodes alternately stacked in a vertical direction, and defining a through hole in the vertical direction, and a pillar structure in the through hole. The pillar structure includes a plurality of channel portions arranged in the through hole to face the gate electrodes and having annular horizontal cross-sections, a plurality of conductive layers arranged in the through hole to face the insulation layers, having annular horizontal cross sections, and having inner walls protruding toward a center of the through hole with respect to inner walls of the channel portions, and a variable resistance material layer on the inner walls of the channel portions and the inner walls of the conductive layers in the through hole. A first portion of the variable resistance material layer overlaps the conductive layers in the vertical direction.

According to some example embodiments, there is provided a memory device including a gate stack on a substrate, the gate stack including a plurality of insulation layers and a plurality of gate electrodes alternately stacked in a vertical direction, and defining a through hole in the vertical direction, a plurality of channel portions in the through hole to face the gate electrodes, a plurality of conductive layers in the through hole to face the insulation layers, and a variable resistance material layer on first sidewalls of the channel portions and second sidewalls of the conductive layers in the through hole and extending in the vertical direction.

According to some example embodiments, there is provided a memory device including a gate stack on a substrate, the gate stack including a plurality of insulation layers and a plurality of gate electrodes alternately stacked in a vertical direction, and defining a through hole extending in the vertical direction, a pillar structure disposed in the through hole and including a plurality of channel portions arranged in the through hole to face the gate electrodes, a plurality of conductive layers in the through hole, in the vertical direction alternately with the channel portions, and including one or more of a metal or a metal nitride, and a variable resistance material layer disposed on inner walls of the channel portions and inner walls of the conductive layers in the through hole, a bit line plug disposed on a top surface of the pillar structure, and a bit line disposed on the bit line plug.

BRIEF DESCRIPTION OF THE DRAWINGS

Various example embodiments of inventive concepts will be more clearly understood from the following detailed description taken in conjunction with the accompanying drawings in which:

FIGS. 14A to 22B are cross-sectional views of a method of manufacturing a memory device according to various example embodiments, wherein, in detail, FIGS. 14A and 22A are cross-sectional views of cross-sections corresponding to FIG. 3, and FIGS. 14B, 15 to 21, and 22B are enlarged cross-sectional views corresponding to the enlarged view of a portion CX1 of FIG. 14A;

DETAILED DESCRIPTION OF VARIOUS
EXAMPLE EMBODIMENTS

Figure 1:
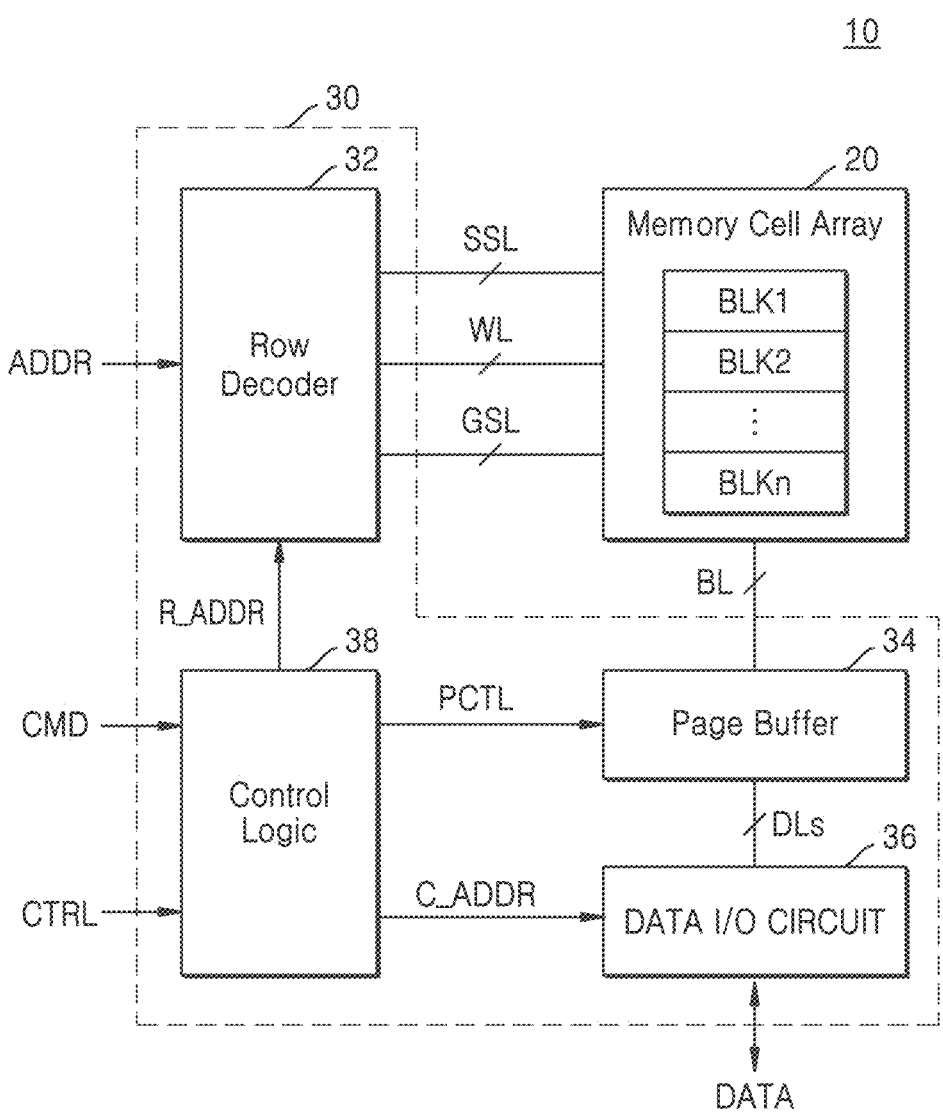
FIG. 1 is a block diagram of a memory device according to embodiments.

FIG. 1 is a block diagram of a memory device 10 according to various example embodiments.

Referring to FIG. 1, the memory device 10 may include a memory cell array 20 and a peripheral circuit 30. The memory cell array 20 includes a plurality of memory cell blocks BLK1, BLK2, . . . , and BLKn. The memory cell blocks BLK1, BLK2, . . . , and BLKn may each include a plurality of memory cells. The memory cell blocks BLK1, BLK2, . . . , and BLKn may be connected to the peripheral circuit 30 through a bit line BL (e.g. a column line), a word line WL (e.g. a row line), a string select line SSL, and a ground select line GSL. The plurality of memory cells may be single level cells (SLCs) and/or multilevel cells (MLCs); example embodiments are not limited thereto.

The peripheral circuit 30 may include a row decoder 32, a page buffer 34, a data input/output circuit 36, and a control logic 38. Although not shown in FIG. 1, the peripheral circuit 30 may further include one or more of an input/output interface, column logic, a voltage generator, a pre-decoder, a temperature sensor, a command decoder, an address decoder, an amplifier circuit, a redundancy analyzer/checker, etc.

The memory cell array 20 may be connected to the page buffer 34 through the bit line BL, and the row decoder 32 may be connected to the row decoder 32 through the word line WL, the string select line SSL, and the ground select line GSL. In the memory cell array 20, the memory cells included in each of the memory cell blocks BLK1, BLK2, . . . , and BLKn may each be a flash memory cell. The memory cell array 20 may include a 3-dimensional memory cell array. The 3D memory cell array may include a plurality of NAND strings, and the NAND strings may each include a plurality of memory cells connected to a plurality of word lines WL vertically stacked on a substrate.

The peripheral circuit 30 may receive one or more of an address ADDR, a command CMD, and a control signal CTRL from a device outside the memory device 10 and may transmit and receive data DATA to and from the device outside the memory device 10.

The row decoder 32 may select at least one of the memory cell blocks BLK1, BLK2, . . . , and BLKn in response to an address ADDR from the outside and select the word line WL, the string select line SSL, and the ground select line GSL corresponding to a selected memory cell block. The row decoder 32 may transmit a voltage for performing a memory operation (such as a program operation or an erase operation or a read operation) to the word line WL corresponding to the selected memory cell block.

The page buffer 34 may be connected to the memory cell array 20 through the bit line BL. The page buffer 34 may operate as a write driver during a program operation and apply a voltage according to the data DATA to be stored in the memory cell array 20 to the bit line BL and may operate as a sense amplifier during a read operation and sense the data DATA stored in the memory cell array 20. The page buffer 34 may operate according to a control signal PCTL provided from the control logic 38.

The data input/output circuit 36 may be connected to the page buffer 34 through data lines DLs. During a program operation, the data input/output circuit 36 may receive the data DATA from a memory controller (not shown) and provide the data DATA to be programmed to the page buffer 34 based on a column address C_ADDR provided from the control logic 38. The data input/output circuit 36 may provide the data DATA to be read stored in the page buffer 34 to the memory controller based on the column address C_ADDR provided from the control logic 38 during a read operation.

The data input/output circuit 36 may transmit an address and/or a command input thereto to the control logic 38 or the row decoder 32. The peripheral circuit 30 may further include an electrostatic discharge (ESD) circuit and a pull-up/pull-down driver (not illustrated).

The control logic 38 may receive a command CMD and a control signal CTRL from the memory controller. The control logic 38 may provide a row address R_ADDR to the row decoder 32 and provide the column address C_ADDR to the data input/output circuit 36. The control logic 38 may generate various internal control signals used in the memory device 10 in response to the control signal CTRL. For example, the control logic 38 may adjust the level of a voltage provided to the word line WL and the bit line BL when a memory operation like a program operation or an erase operation is performed.

Figure 2:
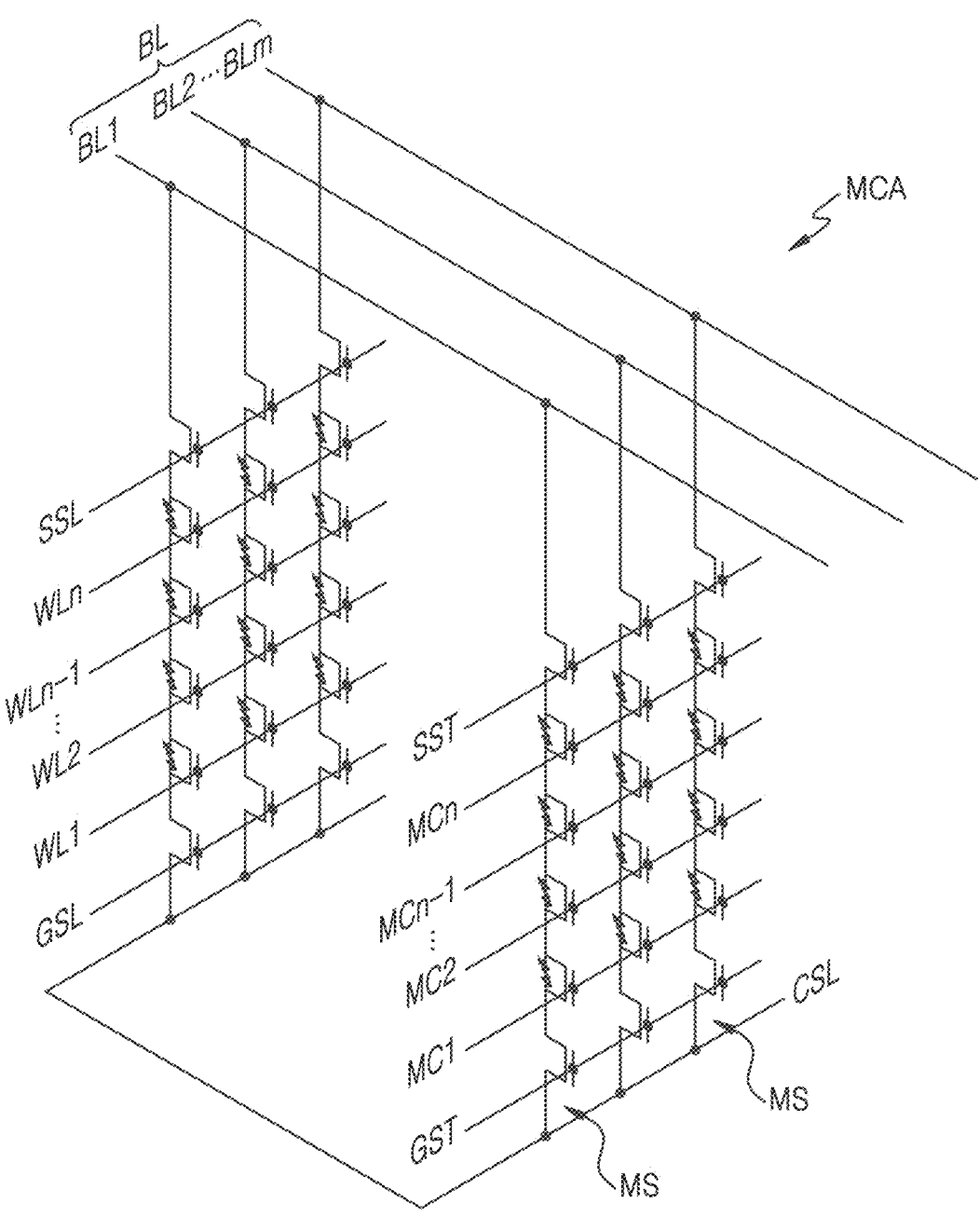
FIG. 2 is an equivalent circuit diagram of a memory cell array of a memory device according to various example embodiments.

FIG. 2 is an equivalent circuit diagram of a memory cell array of the memory device 10 according to various example embodiments.

Referring to FIG. 2, a memory cell array MCA may include a plurality of memory cell strings MS. The memory cell array MCA may include a plurality of bit lines BL: BL1, BL2, . . . , and BLm, a plurality of word lines WL: WL1, WL2, WLn−1, and WLn, at least one string select line SSL, at least one ground select line GSL, and a common source line CSL. The memory cell strings MS may be formed or arranged between the bit lines BL: BL1, BL2, and BLm and the common source line CSL. Although FIG. 2 shows a case in which the memory cell strings MS each include two string select lines SSL, inventive concepts are not limited thereto. For example, the memory cell strings MS may each include one string select line SSL.

The memory cell strings MS may each include the string select transistor SST, the ground select transistor GST, and a plurality of memory cell transistors MC1, MC2, . . . , MCn−1, and MCn. A drain region of the string select transistor SST may be connected to the bit lines BL: BL1, BL2, . . . , and BLm, and a source region of the ground select transistor GST may be connected to the common source line CSL. The common source line CSL may be or may correspond to a region in which source regions of a plurality of ground select transistors GST are connected in common.

The string select transistor SST may be connected to the string select line SSL, and the ground select transistor GST may be connected to the ground select line GSL. The memory cell transistors MC1, MC2, . . . , MCn−1, and MCn may be connected to the word lines WL: WL1, WL2, . . . , WLn−1, and WLn, respectively.

Figure 3:
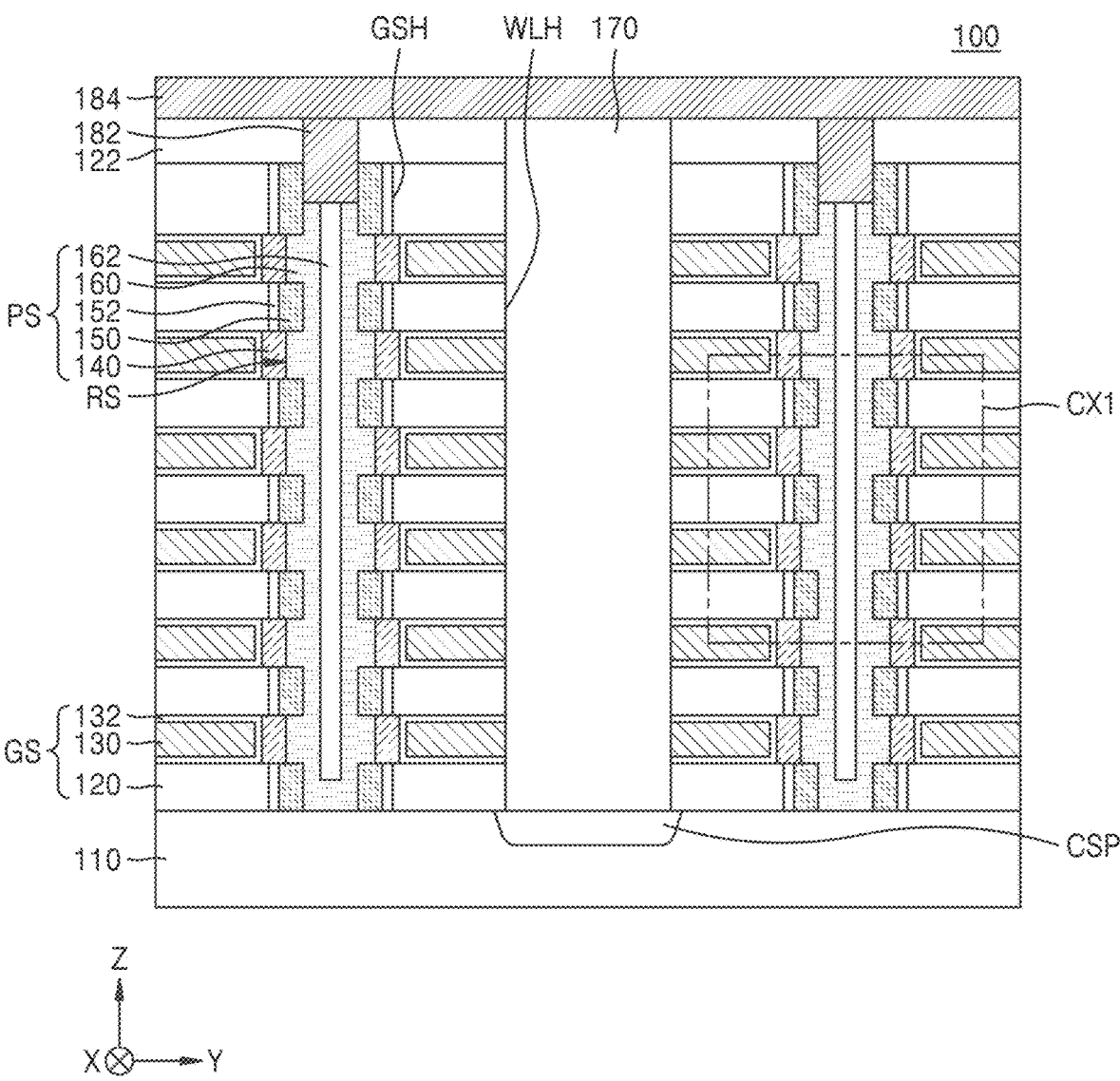
FIG. 3 is a cross-sectional view of a memory device according to various example embodiments.
Figure 4:
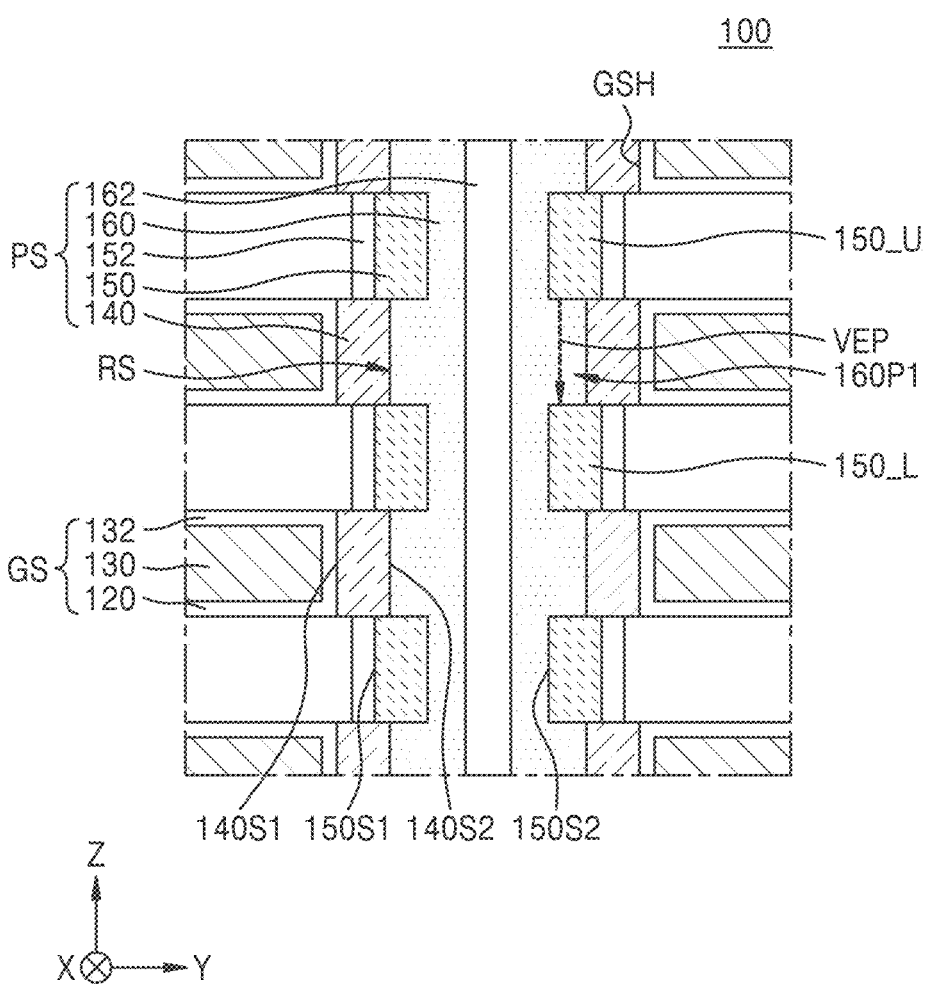
FIG. 4 is an enlarged view of a portion CX1 of FIG. 3.
Figure 5:
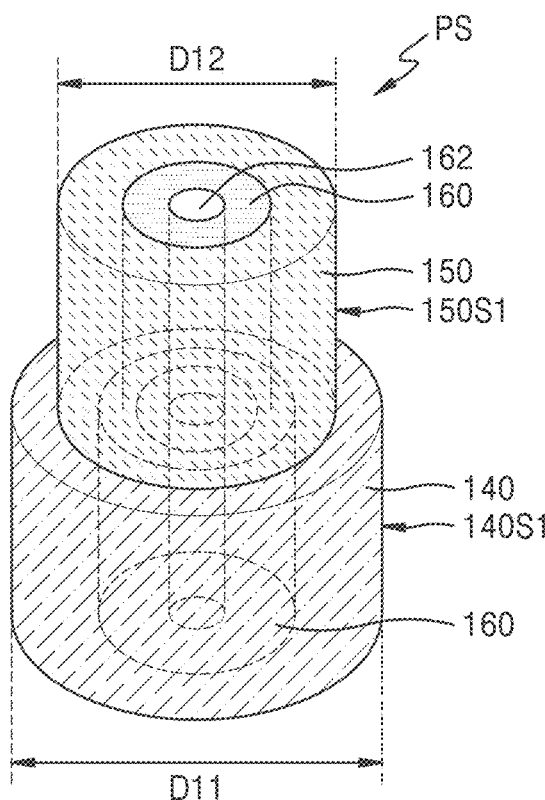
FIG. 5 is a schematic perspective view of a portion of a pillar structure of FIG. 3.

FIG. 3 is a cross-sectional view of a memory device 100 according to various example embodiments. FIG. 4 is an enlarged view of a portion CX1 of FIG. 3; FIG. 5 is a schematic perspective view of a portion of a pillar structure PS of FIG. 3.

Referring to FIGS. 3 to 5, the memory device 100 may include a gate stack, a common source line, a pillar structure, and an isolation structure arranged on a substrate 110.

The substrate 110 may include a semiconductor material, e.g., one or more of a group IV semiconductor, a group III-V compound semiconductor, or a group II-VI oxide semiconductor. For example, the group IV semiconductor may include silicon (Si), germanium (Ge), or silicon-germanium. The substrate 110 may be provided as, e.g. may be initially provided as, a bulk wafer or an epitaxial layer. In some example embodiments, the substrate 110 may include a silicon-on-insulator (SOI) substrate and/or a germanium-on-insulator (GeOI) substrate.

A gate stack GS may include a plurality of insulation layers 120 and a plurality of gate electrodes 130 alternately arranged on the substrate 110. The gate electrodes 130 may be arranged to be spaced apart from one another in a vertical direction Z. The insulation layers 120 may each be disposed between two adjacent gate electrodes 130, and an insulation layer 120 may be disposed between the bottommost gate electrode 130 and the substrate 110. An upper insulation layer 122 may be disposed on the topmost insulation layer 120.

The bottommost gate electrode 130 from among the gate electrodes 130 may correspond to the ground select line GSL shown in FIG. 2, the topmost gate electrode 130 from among the gate electrodes 130 may correspond to the string select line SSL shown in FIG. 2, and the remaining gate electrodes 130 may correspond to the word lines WL shown in FIG. 2. In some example embodiments, any one of the gate electrodes 130 may correspond to a dummy word line (not shown), e.g. a word line that is not electrically active during operation of the semiconductor device.

The gate stack GS may include or define a through hole GSH extending in the vertical direction Z above the substrate 110. The through hole GSH may have a circular cross-section and may penetrate through each gate stack GS in the vertical direction Z to expose the top surface of the substrate 110.

The gate stack GS may further include a gate insulation layer 132 covering the top surface and the bottom surface of each of the gate electrodes 130. The gate insulation layer 132 may be provided between one gate electrode 130 and the insulation layer 120 disposed thereabove and between the one gate electrode 130 and the insulation layer 120 disposed therebelow. According to various example embodiments, the insulation layers 120 may include silicon oxide, and the gate electrodes 130 may include tungsten, titanium, titanium nitride, tantalum, tantalum nitride, etc. The gate insulation layer 132 may include at least one of silicon oxide, aluminum oxide, or metal oxide like hafnium oxide.

The pillar structure PS may be disposed inside the through hole GSH. The pillar structure PS may include a plurality of channel portions 140, a plurality of conductive layers 150, spacers 152, a variable resistance material layer 160, and a buried insulation layer 162.

The channel portions 140 may be arranged at positions facing the gate electrodes 130 in the through hole GSH. The channel portions 140 may be arranged to be spaced apart from one another in the vertical direction Z, and the channel portions 140 may have a ring-like or annular horizontal cross-sectional shape. An outer wall 140S1 of each of the channel portions 140 may be surrounded by the gate electrodes 130, and the gate insulation layer 132 may be provided between the outer wall 140S1 of each of the channel portions 140 and a corresponding gate electrode 130. According to various example embodiments, the channel portions 140 may not be doped, e.g. may include polysilicon that is not doped with an impurity.

The conductive layers 150 may be arranged at positions facing the insulation layers 120 in the through hole GSH. The conductive layers 150 may be arranged to be spaced apart from one another in the vertical direction Z, and the conductive layers 150 may each have a ring-like or an annular horizontal cross-sectional shape. The conductive layers 150 may each be disposed between two adjacent channel portions 140 from among the channel portions 140.

According to various example embodiments, the conductive layers 150 may include at least one of titanium, titanium nitride, aluminum, platinum, tantalum, and tantalum nitride.

According to various example embodiments, inner walls 150S2 of the conductive layers 150 may protrude toward the inside of the through hole GSH with respect to inner walls 140S2 of the channel portions 140, and, as shown in FIG. 5, outer walls 140S1 of the channel portions 140 may protrude with respect to outer walls 150S1 of the conductive layers 150 outwardly (e.g., in directions toward the gate electrodes 130. Therefore, the conductive layers 150 and the channel portions 140 may be arranged to at least partially overlap each other in the vertical direction Z. The channel portions 140 may each have a first outer diameter D11 in a horizontal direction X, and the conductive layers 150 may each have a second outer diameter D12 smaller than the first outer diameter D11 in the horizontal direction X.

Spacers 152 may be arranged between the outer walls 150S1 of the conductive layers 150 and the insulation layers 120. The top surface and the bottom surface of a spacer 152 may contact the channel portions 140. According to various example embodiments, the spacer 152 may include silicon nitride.

The variable resistance material layer 160 may be disposed on the inner walls 140S2 of the channel portions 140 and the inner walls 150S2 of the conductive layers 150 in the through hole GSH and may extend in the vertical direction Z. The buried insulation layer 162 may fill the inside of the through hole GSH on the variable resistance material layer 160. According to some example embodiments, the buried insulation layer 162 may be omitted and the variable resistance material layer 160 may fill the inside of the through hole GSH.

According to various example embodiments, a plurality of recesses RS may be defined by the top surfaces and the bottom surfaces of the conductive layers 150 and the inner walls 140S2 of the channel portions 140, and a first portion 160P1 of the variable resistance material layer 160 may be disposed in the inside of the recesses RS and fill the inside of the recesses RS. Therefore, the variable resistance material layer 160 may have a shape in which the first portion 160P1 of the variable resistance material layer 160 protrudes outward toward the recesses RS with respect to the remaining portion of the variable resistance material layer 160.

According to various example embodiments, the variable resistance material layer 160 may include a material whose internal resistance varies as an electrical path such as a filament is formed due to a difference between voltages applied to both ends of the variable resistance material layer 160. For example, the filament may be formed by oxygen vacancies due to movement of oxygen included in the variable resistance material layer 160. According to various example embodiments, the variable resistance material layer 160 may include a perovskite-based material or a transition metal oxide. The perovskite-based material may include, for example, STO ($SrTiO_3$), BTO ($BaTiO_3$), PCMO ($Pr_{1-x}CaxMnO_3$), etc., and the transition metal oxide may include, for example, titanium oxide ($TiO_x$), zirconium oxide, and the like. ($ZrO_x$), aluminum oxide ($AlO_x$), hafnium oxide ($HfO_x$), tantalum oxide ($TaO_x$), niobium oxide ($NbO_x$), cobalt oxide ($CoO_x$), tungsten oxide ($WO_x$), lanthanum oxide ($LaO_x$), zinc oxide ($ZnO_x$), etc. These may be used alone or in combination of two or more. According to various example embodiments, the variable resistance material layer 160 may have a single layer structure including the above-described material or a composite layer structure in which a plurality of layers are stacked. According to various example embodiments, the variable resistance material layer 160 may have a thickness from about 5 nanometers to about 20 nanometers, but is not limited thereto.

According to various example embodiments, the first portion 160P1 of the variable resistance material layer 160 may contact the top surface and the bottom surface of the conductive layer 150 and an inner wall 140S2 of a channel portion 140. For example, when, from between two adjacent conductive layers 150, the conductive layer 150 disposed at a higher level is referred to as an upper conductive layer 150_U and the conductive layer 150 disposed at a lower level is referred to as a lower conductive layer 150_L, a recess RS may be formed between the bottom surface of the upper conductive layer 150_U and the top surface of the lower conductive layer 150_L, and the first portion 160P1 of the variable resistance material layer 160 may be disposed inside the recess RS. The first portion 160P1 of the variable resistance material layer 160 surrounded by one channel portion 140 may contact the bottom surface of the upper conductive layer 150_U and the top surface of the lower conductive layer 150_L. The first portion 160P1 of the variable resistance material layer 160 may vertically overlap the upper conductive layer 150_U and the lower conductive layer 150_L, and the first portion 160P1 of the variable resistance material layer 160 may include a vertical electrical path VEP extending in the vertical direction between the upper conductive layer 150_U and the lower conductive layer 150_L.

According to various example embodiments, an interfacial layer may be further formed between the channel portions 140 and the variable resistance material layer 160 and between the conductive layers 150 and the variable resistance material layer 160. For example, the interfacial layer may include silicon oxide and/or silicon nitride.

A stack separation hole WLH penetrating through the gate stack GS and extending in a horizontal direction may be formed, and a stack separating insulation layer 170 may be disposed in the stack separation hole WLH. A common source plate CSP may be disposed on a portion of the substrate 110 exposed by the bottom portion of the stack separation hole WLH. Although not shown, a common source plug (not shown) electrically connected to the common source plate CSP may be further disposed in the stack separation hole WLH. For example, the common source plate CSP may include one or more of a metal, a metal nitride, a metal silicide, etc.

A bit line plug 182 penetrating through the upper insulation layer 122 may be disposed on the pillar structure PS. The bottom surface of the bit line plug 182 may extend to a level lower than the top surface of the topmost conductive layer 150 and sidewalls of the bit line plug 182 may be surrounded by the topmost conductive layer 150. A bit line 184 electrically connected to the bit line plug 182 may be disposed on the upper insulation layer 122.

In general, a 3-dimensional memory device using a variable resistance material layer employs a silicon-insulator-silicon (SIS) structure including a silicon channel and a variable resistance material layer. However, a relatively high operating voltage is needed or desired, because an electrical path between a silicon channel and a variable resistance material layer is relatively long (e.g., a portion in which the electrical path extends in a horizontal direction is included).

The pillar structure PS of the memory device 100 according to various example embodiments includes the channel portions 140 and the conductive layers 150 that are alternately arranged, and, in particular, the first portion 160P1 of the variable resistance material layer 160 may be disposed inside the recess RS between the conductive layers 150. The vertical electrical path VEP may be formed by or created movement of oxygen vacancies in the first portion 160P1 of the variable resistance material layer 160 between the two adjacent conductive layers 150. For example, since a direction of applying a field for driving memory cells and the direction of the vertical electrical path VEP are both vertical directions and coincide with each other, the memory device 100 may operate at a relatively low driving voltage. Also, the conductive layer 150 includes a metal or a metal nitride, and, since the material of the conductive layer 150 may be selected to exhibit optimized or improved performance in combination with a material constituting the variable resistance material layer 160, the memory device 100 may exhibit improved or optimized performance.

Figure 6:
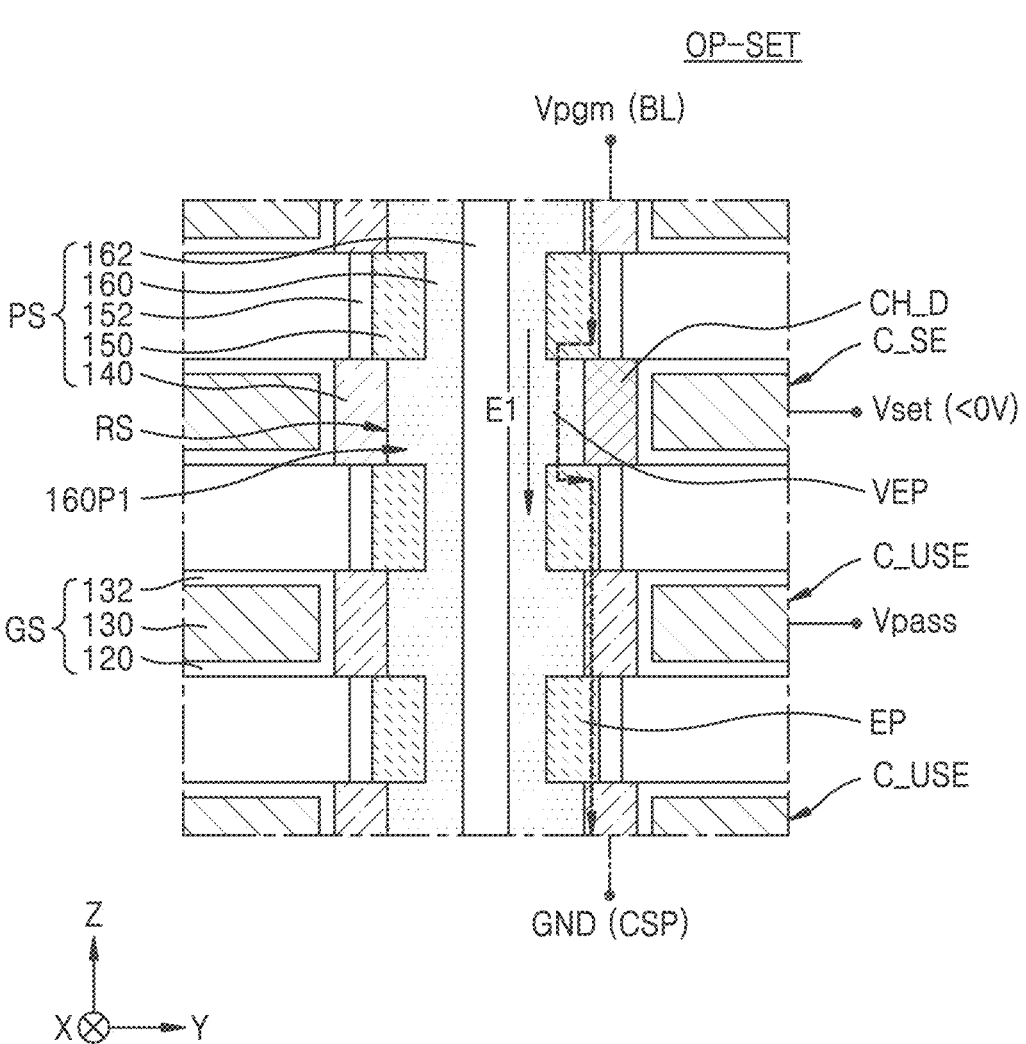
FIG. 6 is a schematic view of a set operation of a memory device according to various example embodiments.
Figure 7:
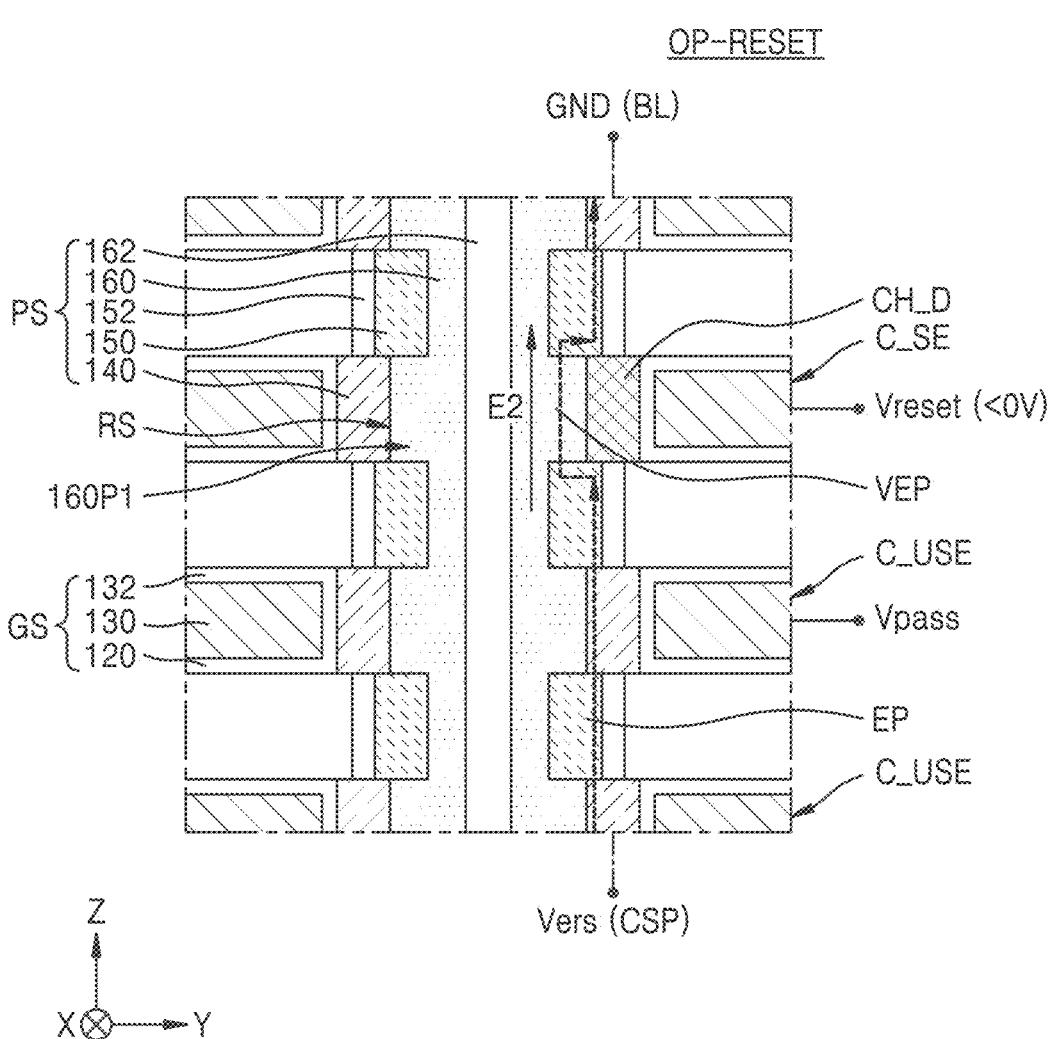
FIG. 7 is a schematic view of a reset operation of a memory device according to various example embodiments.
Figure 8:
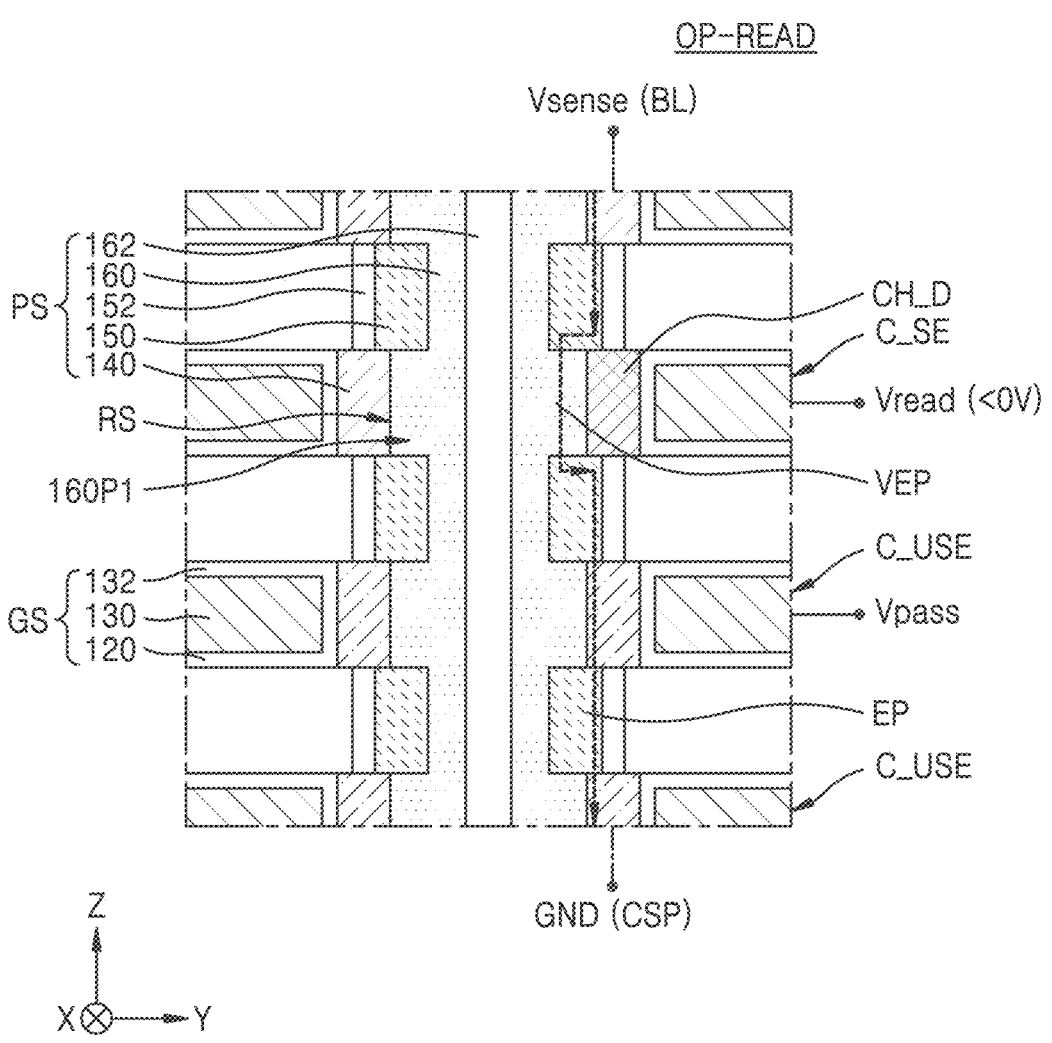
FIG. 8 is a schematic view of a read operation of a memory device according to various example embodiments.

FIG. 6 is a schematic diagram showing a set operation OP-SET of the memory device 100 according to various example embodiments, and FIG. 7 is a schematic diagram showing a reset operation OP-RESET of the memory device 100, and FIG. 8 is a schematic diagram showing a read operation OP-READ of the memory device 100.

Referring to FIG. 6, in the set operation OP-SET of the memory device 100, a selected cell C_SE is turned off by applying a set voltage Vset lower than a threshold voltage (e.g., a set voltage Vset lower than 0 V) to the gate electrode 130 of the selected cell C_SE, and an unselected cell C_USE is turned on by applying a voltage higher than the threshold voltage (e.g., a pass voltage Vpass) to the gate electrode 130 of the unselected cell C_USE. A ground voltage GND may be applied to the common source plate CSP, and a program voltage Vpgm may be applied to the bit line 184. For example, the program voltage Vpgm may have a certain value at which the selected cell C_SE is changed to a low resistance state. For example, the program voltage Vpgm may have a value greater than 0 V. In this case, a ground voltage identical to the ground voltage GND applied to the common source plate CSP may be applied to the bit line 184 electrically connected to unselected cell strings.

An electric field E1 is generated in the channel portion 140 of the selected cell C_SE due to a voltage condition applied to the selected cell C_SE, and a depletion channel CH_D may be formed in the channel portion 140 of the selected cell C_SE by the electric field E1. Oxygen vacancies may be evenly distributed in the first portion 160P1 of the variable resistance material layer 160 disposed to face the depletion channel CH_D. The oxygen vacancies may be aligned in a vertical direction by the electric field E1 acting on the first portion 160P1 and a filament may be formed through a reduction reaction of a transition metal, etc. Due to the filament, the vertical electrical path VEP may be formed in the first portion 160P1 of the variable resistance material layer 160. Meanwhile, as the unselected cell C_USE is turned on, an electrical path EP may be formed in the vertical direction Z along the channel portion 140 of the unselected cell C_USE and the conductive layer 150 disposed on and below the channel portion 140, and the electrical path EP may be connected to the vertical electrical path VEP formed in the first portion 160P1 of the selected cell C_SE.

According to various example embodiments, as the first portion 160P1 of the variable resistance material layer 160 is disposed in the recess RS and the conductive layer 150 is disposed on and below the first portion 160P1, the vertical electrical path VEP may be formed in the vertical direction Z and in the same direction as that of the electric field E1 from a portion of the conductive layer 150 on the first portion 160P1 to the first portion 160P1 and from the first portion 160P1 to a portion of the conductive layer 150 below the first portion 160P1. The selected cell C_SE in which the vertical electrical path VEP is formed may be considered as a state where data "1" is stored and/or may be referred to as an "ON state".

Referring to FIG. 7, in the reset operation OP-RESET of the memory device 100, the selected cell C_SE is turned off by applying a reset voltage Vreset lower than a threshold voltage (e.g., a reset voltage Vreset lower than 0 V) to the gate electrode 130 of the selected cell C_SE, and an unselected cell C_USE is turned on by applying a voltage higher than the threshold voltage (e.g., a pass voltage Vpass) to the gate electrode 130 of the unselected cell C_USE. An erase voltage Vers may be applied to the common source plate CSP and the ground voltage GND may be applied to the bit line 184. The erase voltage Vers may have a certain value at which the selected cell C_SE is changed to a high resistance state. For example, the erase voltage Vers may have a value greater than 0 V. According to various example embodiments, the erase voltage Vers may have a value identical or similar to that of the program voltage Vpgm, but is not limited thereto. In this case, an erase voltage identical to the erase voltage Vers applied to the common source plate CSP may be applied to the bit line 184 electrically connected to unselected cell strings.

An electric field E2 is formed in the channel portion 140 of the selected cell C_SE by a voltage condition applied to the selected cell C_SE, and the electric field E2 may be in a direction opposite to that of the electric field E1 formed in the set operation. The depletion channel CH_D may be formed in the channel portion 140 of the selected cell C_SE by the electric field E2.

In the reset operation, the filament formed in the set operation in the first portion 160P1 of the variable resistance material layer 160 disposed to face the depletion channel CH_D may be removed. For example, oxygen may be moved in a vertical direction by the electric field E2 acting on the first portion 160P1, and the filament may be removed through an oxidation reaction of a transition metal. For example, a vertical electrical path VEP that is in a direction opposite to that of the vertical electrical path VEP formed in the set operation may be formed and, through the vertical electrical path VEP formed in the first portion 160P1 of the variable resistance material layer 160, the filament may be removed and oxygen vacancy may be evenly distributed in the first portion 160P1 of the variable resistance material layer 160. As such, the selected cell C_SE in which the filament is removed or extinguished through the vertical electrical path VEP may be considered as a state where data "0" is stored and/or may be referred to as an "OFF state".

Referring to FIG. 8, in the read operation OP-READ of the memory device 100, the selected cell C_SE is turned off by applying a read voltage Vread lower than a threshold voltage (e.g., a read voltage Vread lower than 0 V) to the gate electrode 130 of the selected cell C_SE, and an unselected cell C_USE is turned on by applying a voltage higher than the threshold voltage (e.g., a pass voltage Vpass) to the gate electrode 130 of the unselected cell C_USE. The ground voltage GND may be applied to the common source plate CSP, and a sensing voltage Vsense may be applied to the bit line 184. The sensing voltage Vsense may have a certain value at which the resistance state of the selected cell C_SE may be detected. For example, the sensing voltage Vsense may have a value greater than 0 V and smaller than that of the program voltage Vpgm. In this case, a ground voltage identical to the ground voltage GND applied to the common source plate CSP may be applied to the bit line 184 electrically connected to unselected cell strings.

A current flow may be sensed when a filament is formed in the selected cell C_SE by a voltage condition applied to the selected cell C_SE, and, in this case, it may be confirmed that the selected cell C_SE is in a state in which data "1" is stored or is in the "ON state". Also, when no filament is formed in the selected cell C_SE, a current flow may not be sensed, and, in this case, it may be confirmed that the selected cell C_SE is in a state in which data "0" is stored or is in the "OFF state".

According to various example embodiments, the memory device 100 may be driven by a bipolar switching method in which directions of electric fields applied to the selected cell C_SE in a set operation and a reset operation are different from each other (e.g., are opposite to each other). Therefore, as compared to a unipolar switching method in which the magnitudes of voltages in a set operation and a reset operation are different from each other, the memory device 100 may be driven at a relatively low operating voltage and/or with a relatively small current. Furthermore, since the conductive layers 150 include metal and/or metal nitride, a variable resistance memory cell employing a stacked structure of a metal/a variable resistance material/a metal or a metal nitride/a variable resistance material/a metal nitride may be implemented, and the memory device 100 may be driven by a lower operating voltage compared to a variable resistance memory cell using silicon. There may be a reduction in overall power consumption and/or an increase in operating speed; example embodiments are not limited thereto.

Figure 9:
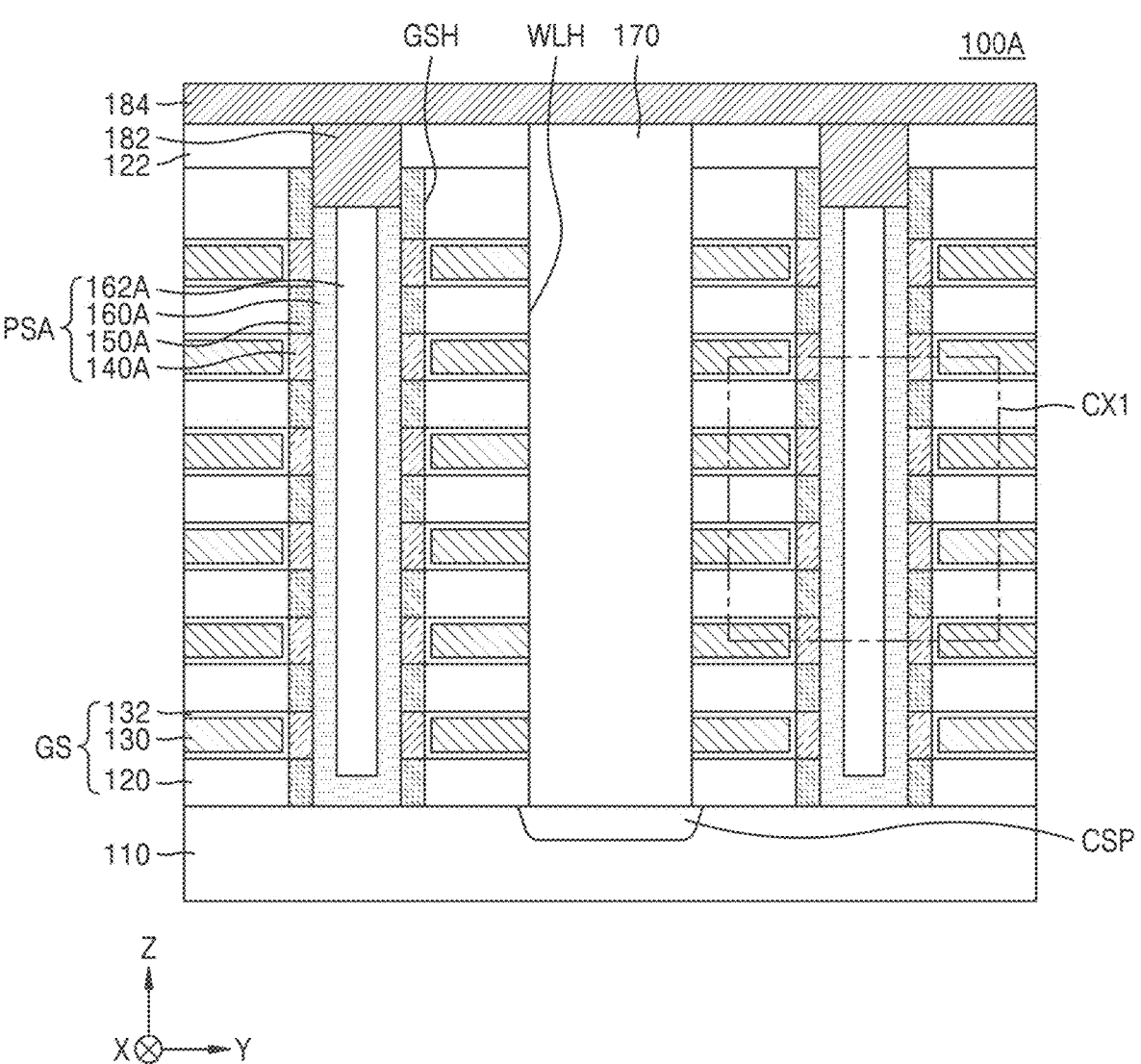
FIG. 9 is a cross-sectional view of a memory device according to various example embodiments.
Figure 10:
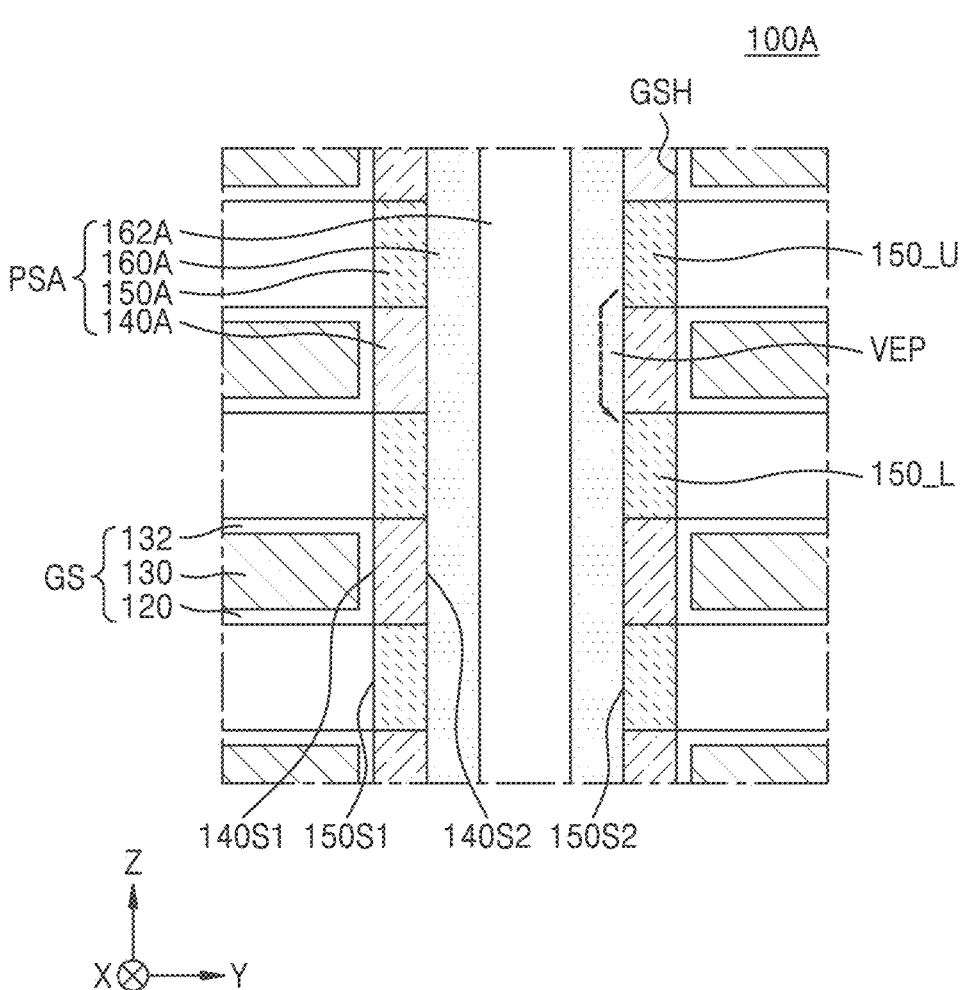
FIG. 10 is an enlarged view of a portion CX1 of FIG. 9.
Figure 11:
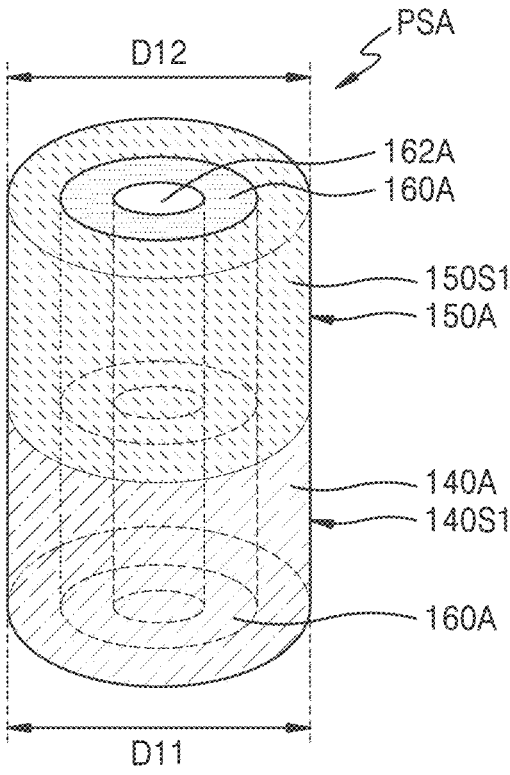
FIG. 11 is a schematic perspective view of a portion of a pillar structure of FIG. 9.

FIG. 9 is a cross-sectional view of a memory device 100A according to various example embodiments. FIG. 10 is an enlarged view of CX1 of FIG. 9. FIG. 11 is a schematic perspective view of a portion of a pillar structure PSA of FIG. 9. In FIGS. 9 to 11, reference numerals same as those in FIGS. 1 to 8 denote the same elements.

Referring to FIGS. 9 to 11, the pillar structure PSA disposed in the through hole GSH may include a plurality of channel portions 140A, a plurality of conductive layers 150A, a variable resistance material layer 160A, and a buried insulating material layer 162A.

The channel portions 140A and the conductive layers 150A may be alternately arranged in the vertical direction Z. The channel portions 140A and the conductive layers 150A may be arranged to overlap in the vertical direction Z. For example, as shown in FIG. 10, the outer walls 140S1 of the channel portions 140A and the outer walls 150S1 of the conductive layers 150A may be aligned with each other, and the inner wall 140S2 of the channel portions 140A and the inner walls 150S2 of the conductive layers 150A may be aligned with each other.

As the inner walls 140S2 of the channel portions 140A and the inner walls 150S2 of the conductive layers 150A are aligned with each other, protrusions, etc. may not be formed on an outer wall of the variable resistance material layer 160A and the variable resistance material layer 160A may have an outer wall extending in the vertical direction Z.

The first portion 160P1 of the variable resistance material layer 160A may be surrounded by inner walls 140S2 of the channel portions 140A. The first portion 160P1 of the variable resistance material layer 160A may include the vertical electrical path VEP extending in a vertical direction between the upper conductive layer 150_U and the lower conductive layer 150_L.

According to various example embodiments, since the conductive layers 150 include metal and/or metal nitride, a variable resistance memory cell employing a stacked structure of a metal/a variable resistance material/a metal or a metal nitride/a variable resistance material/a metal nitride may be implemented, and the memory device 100A may be driven by a lower operating voltage compared to a variable resistance memory cell using silicon. Also, since the material of the conductive layer 150A may be selected to exhibit improved or optimized performance in combination with a material constituting the variable resistance material layer 160A, the memory device 100A may exhibit improved or optimized performance.

Figure 12:
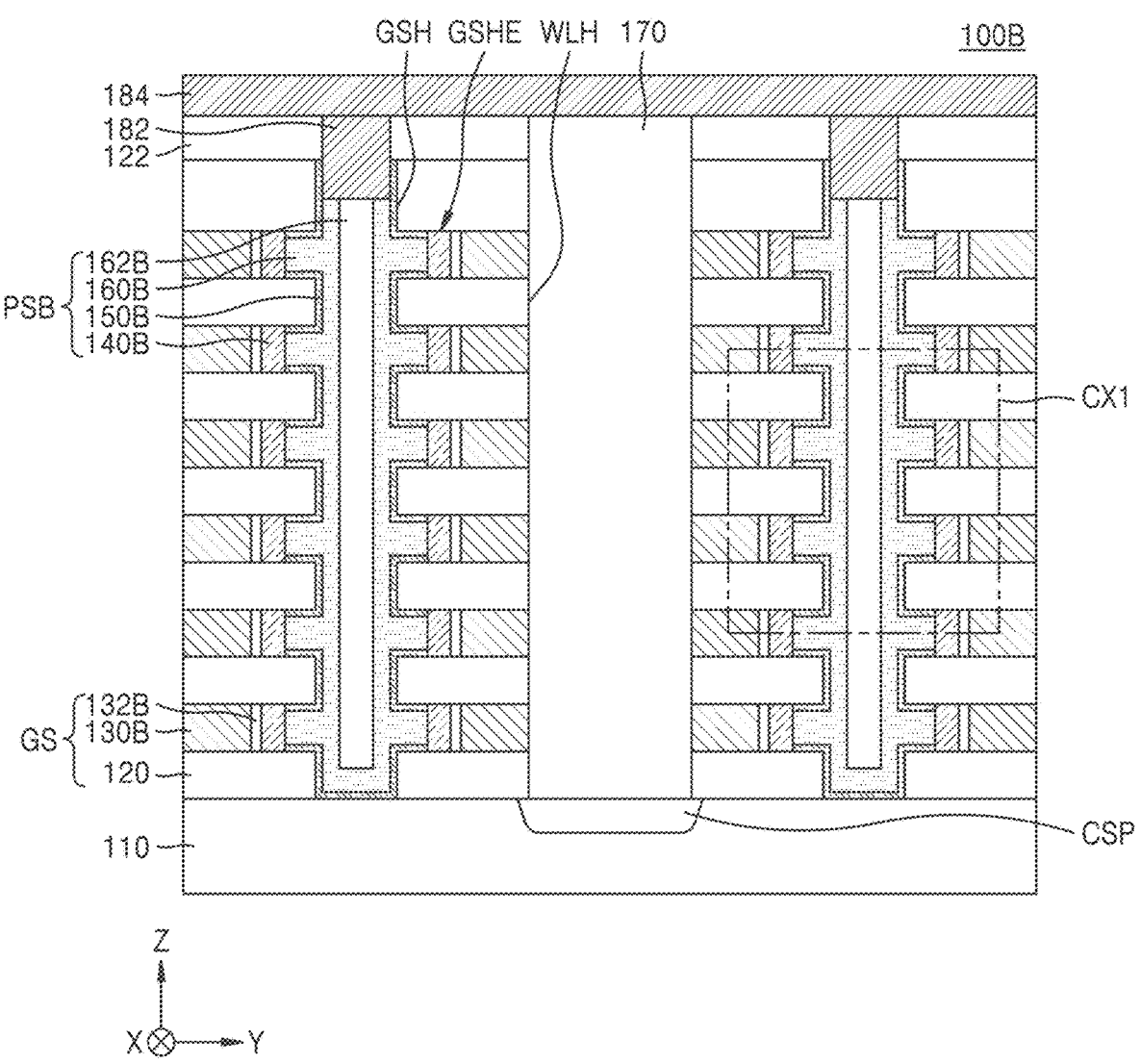
FIG. 12 is a cross-sectional view of a memory device according to various example embodiments.
Figure 13:
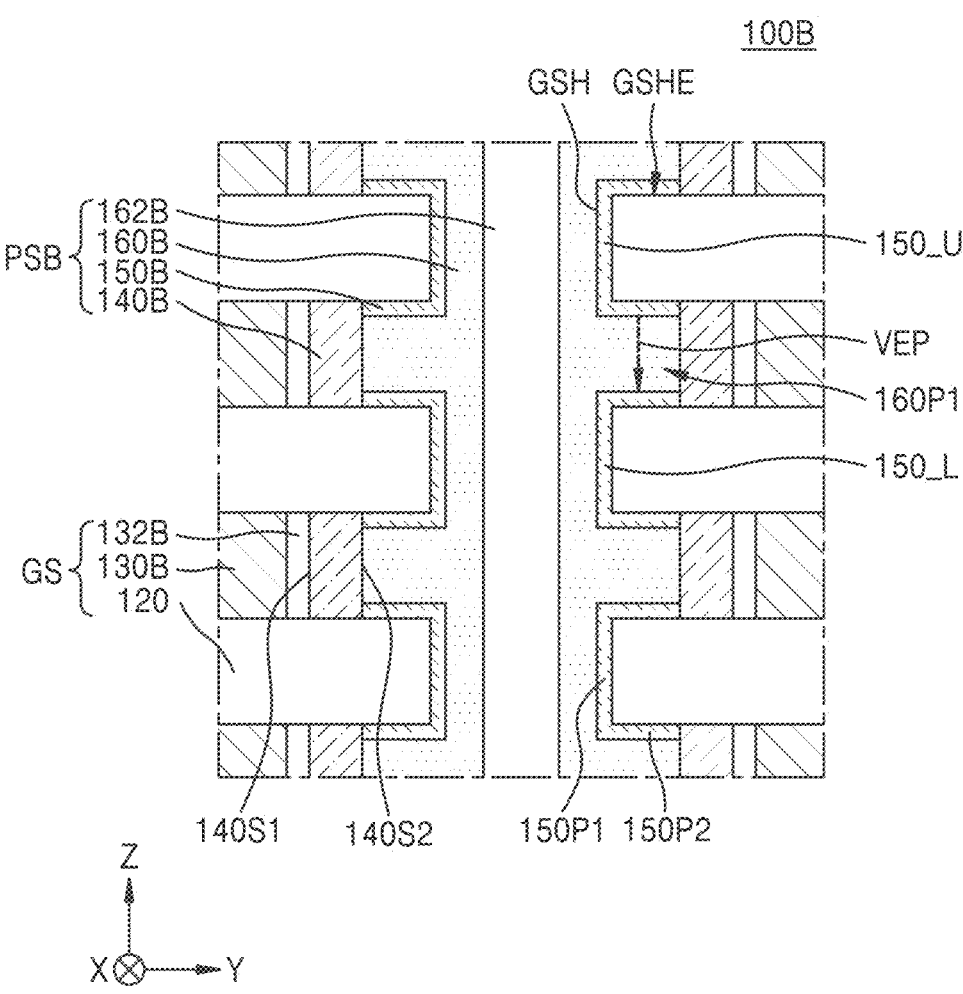
FIG. 13 is an enlarged view of a portion CX1 of FIG. 12.

FIG. 12 is a cross-sectional view of a memory device 100B according to various example embodiments. FIG. 13 is an enlarged view of CX1 of FIG. 12; In FIGS. 12 and 13, reference numerals same as those in FIGS. 1 to 11 denote the same elements.

Referring to FIGS. 12 and 13, the through hole GSH may include an extended space GSHE that protrudes in lateral directions toward the gate electrodes 130. The extended space GSHE may be defined between two adjacent insulation layers 120 from among the insulation layers 120 and by sidewalls of the gate electrodes 130. A pillar structure PSB may have portions extending in the vertical direction Z in the through hole GSH and protruding in lateral directions toward the extended space GSHE.

The pillar structure PSB may include a plurality of channel portions 140B, a plurality of conductive layers 150B, a variable resistance material layer 160B, and a buried insulation layer 162B.

The channel portions 140B may be arranged at positions in correspondence to the gate electrodes 130 in the extended space GSHE. The gate insulation layer 132 may be disposed between each of the channel portions 140B and each of the gate electrodes 130. In some example embodiments, the gate insulation layer 132 may include silicon oxide formed by a thermal oxidation process, and the gate insulation layer 132 may not be formed between the gate electrodes 130 and the insulation layers 120.

The conductive layers 150B may be arranged at positions facing the insulation layers 120. The conductive layers 150B are arranged on the sidewall of the insulation layer 120 disposed on the inner wall of the through hole GSH and may extend onto the top surface and the bottom surface of the insulation layer 120 disposed in the through hole GSH. The conductive layers 150B may each include a first portion 150P1 disposed on the sidewall of the insulation layer 120 and extending in the vertical direction Z and a second portion 150P2 connected to the first portion 150P1 and extending onto the top surface and the bottom surface of the insulation layer 120 toward the inside of the extended space GSHE.

The variable resistance material layer 160B may be disposed to cover first portions 150P1 of the conductive layers 150B in the through hole GSH and extend laterally toward the inside of the extended space GSHE to cover the channel portions 140B and second portions 150P2 of the conductive layers 150B. The first portion 160P1 of the variable resistance material layer 160B may fill the extended space GSHE. For example, the recess RS may be defined between the bottom surface of the second portion 150P2 of the upper conductive layer 150_U and the top surface of the second portion 150P2 of the lower conductive layer 150_L, and the first portion 160P1 of the variable resistance material layer 160B may be disposed to fill the inside of the recess RS. In the extended space GSHE, the first portion 160P1 of the variable resistance material layer 160B may contact the bottom surface of the second portion 150P2 of the upper conductive layer 150_U and the top surface of the second portion 150P2 of the lower conductive layer 150_L, and the second portions 150P2 of the conductive layers 150B and the first portion 160P1 of the variable resistance material layer 160B arranged in the extended space GSHE may be arranged to overlap the insulation layers 120 in the vertical direction Z.

The first portion 160P1 of the variable resistance material layer 160A may vertically overlap the second portion 150P2 of the upper conductive layer 150_U and the second portion 150P2 of the lower conductive layer 150_L in the extended space GSHE and may be surrounded by the inner walls 140S2 of the channel portions 140A. The first portion 160P1 of the variable resistance material layer 160A may include the vertical electrical path VEP extending in a vertical direction between the second portion 150P2 of the upper conductive layer 150_U and the second portion 150P2 of the lower conductive layer 150_L.

The memory device 100B according to various example embodiments may be driven by a lower operating voltage as compared to a variable resistance memory cell using silicon. Alternatively or additionally, since the material of the conductive layers 150B may be selected to exhibit improved or optimized performance in combination with a material constituting the variable resistance material layer 160B, the memory device 100B may exhibit improved or optimized performance.

Figure 14A:
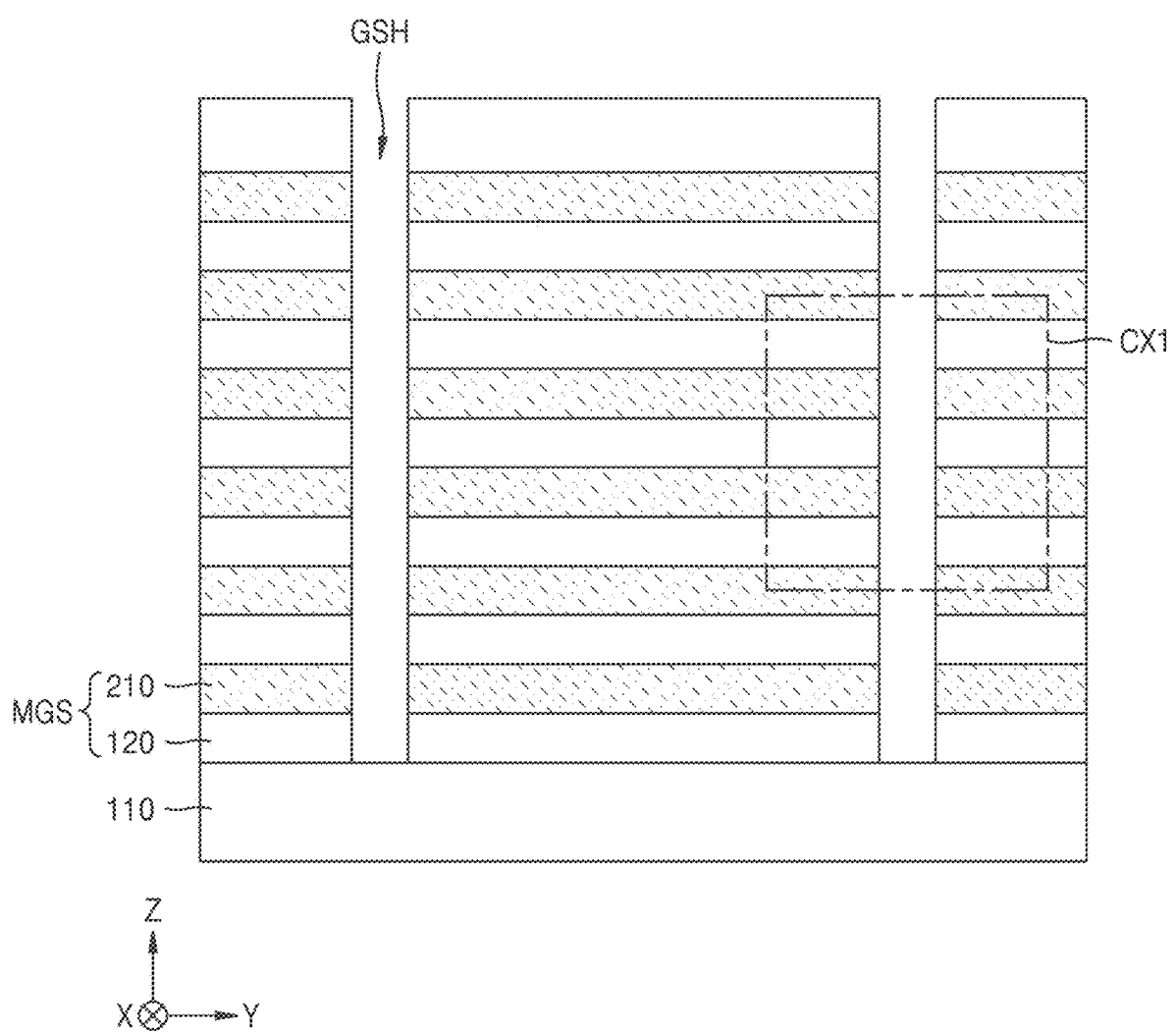

FIGS. 14A to 22B are cross-sectional views of a method of manufacturing the memory device 100 according to various example embodiments. In detail, FIGS. 14A and 22A are cross-sectional views of cross-sections corresponding to FIG. 3, and FIGS. 14B, 15 to 21, and 22B are enlarged cross-sectional views corresponding to the enlarged view of the CX1 portion of FIG. 14A.

Figure 14B:
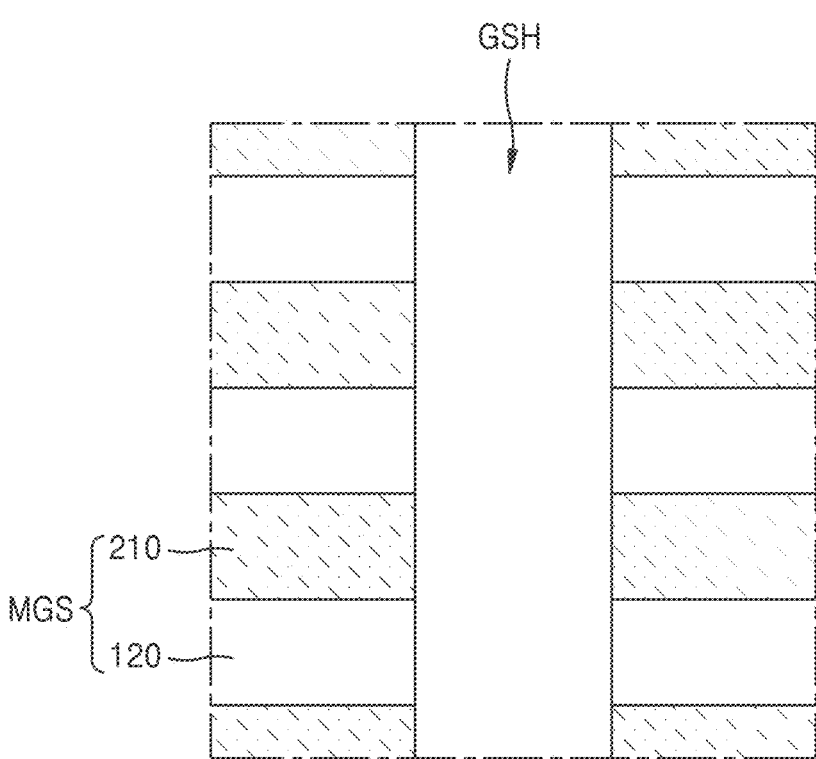
Figure 14B:
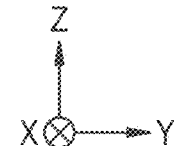

Referring to FIGS. 14A and 14B, the insulation layers 120 and a plurality of sacrificial layers 210 may be alternately formed on the substrate 110, thereby forming a mold gate stack MGS. According to various example embodiments, the insulation layers 120 may each together, or independently, include an insulating material like silicon oxide or silicon oxynitride, and the sacrificial layers 210 may each together, or independently, include silicon nitride, silicon oxynitride, or polysilicon doped with an impurity. A thickness of each of the sacrificial layers 210 may be the same as each other, or at least one may be different from others. A thickness of each of the insulation layers 120 may be the same as each other, or at least one may be different from others. A thickness of the insulation layers 120 may be the same as, or different from, a thickness of the sacrificial layers 210. A number of sacrificial layers 210 and/or a number of the insulation layers 120 may be the same as, or different from (e.g. greater than or less than), that illustrated in the figures.

Thereafter, a mask pattern (not shown) may be formed on the topmost insulation layer 120, and the insulation layers 120 and the sacrificial layers 210 may be patterned by using the mask pattern as an etching mask, thereby forming the through hole GSH.

According to various example embodiments, the through hole GSH may be formed to have a circular or elliptical horizontal cross-sectional shape, and the through hole GSH may extend in the vertical direction Z to expose the top surface of the substrate 110.

Figure 15:
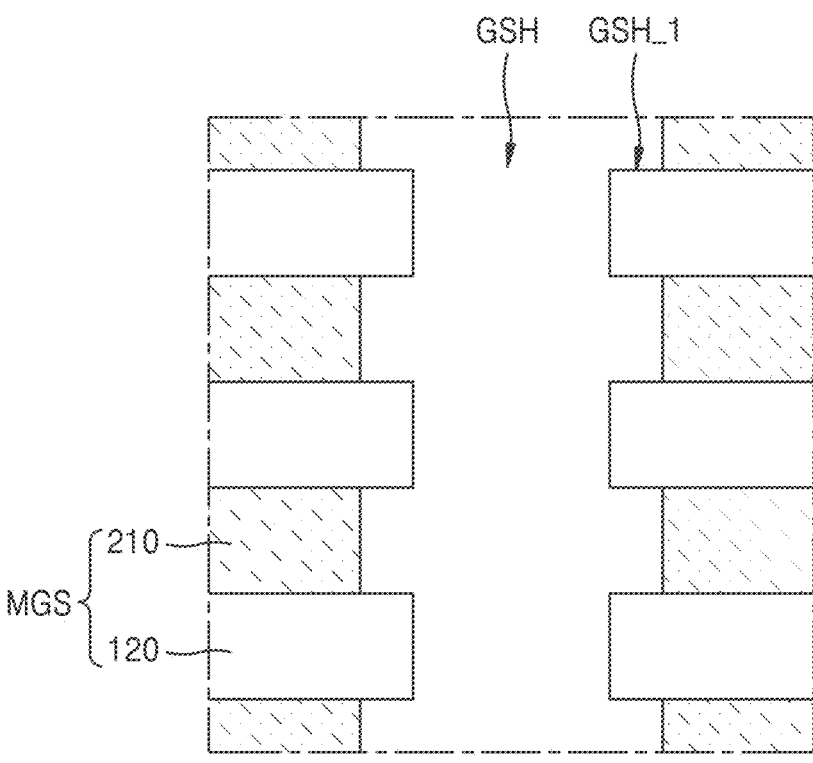
Figure 15:
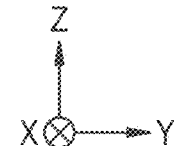

Referring to FIG. 15, a recessing process for laterally removing the sacrificial layer 210 exposed on the inner wall of the through hole GSH may be performed, thereby forming an extended space GSH_1 extending from the through hole GSH in lateral directions.

According to various example embodiments, the recessing process may be performed by using an etching process using an etchant having an etch selectivity with respect to (e.g. having a higher or lower etch rate than) a material constituting the sacrificial layers 210, and, during the recessing process, the insulation layers 120 may be hardly etched. According to various example embodiments, the recessing process may be a wet etching process using an etchant containing phosphoric acid, but inventive concepts are not limited thereto. The top surfaces and the bottom surfaces of the insulation layers 120 may be exposed by the extended space GSH_1.

Figure 16:
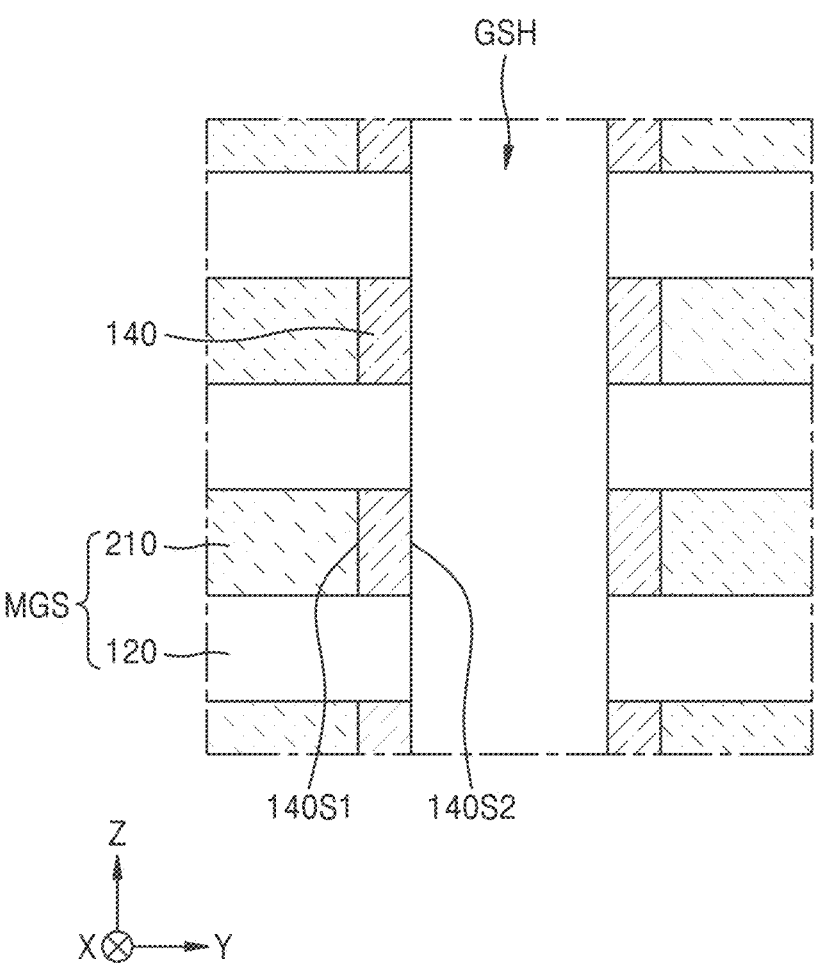

Referring to FIG. 16, the channel portions 140 filling the inside of the extended space GSH_1 may be formed in spaces between the insulation layers 120.

According to various example embodiments, the channel portions 140 may be formed through one or more of a chemical vapor deposition (CVD) process, an atomic layer deposition (ALD) process, etc. by using polysilicon that is not doped with an impurity.

According to some example embodiments, a conductive layer (not shown) may be conformally formed on the inner wall of the through hole GSH to a sufficient thickness to completely fill the extended space GSH_1, and then an anisotropic etching process may be performed inside the through hole GSH, such that the conductive layer remains only inside the extended space GSH_1. As a result, the channel portions 140 may be formed. According to some example embodiments, a conductive layer (not shown) filling the inside of the extended space GSH_1 may be formed through a formation process having a condition in which selective deposition may be performed on surfaces of the sacrificial layers 210 with respect to surfaces of the insulation layers 120 (for example, only on the surfaces of the sacrificial layers 210), thereby forming the channel portions 140.

According to various example embodiments, the channel portions 140 may have a ring-like shape or an annular shape. The channel portions 140 may each include the outer wall 140S1 and the inner wall 140S2, the inner wall 140S2 may be exposed in the through hole GSH, and the outer wall 140S1 may contact the sacrificial layer 210.

Figure 17:
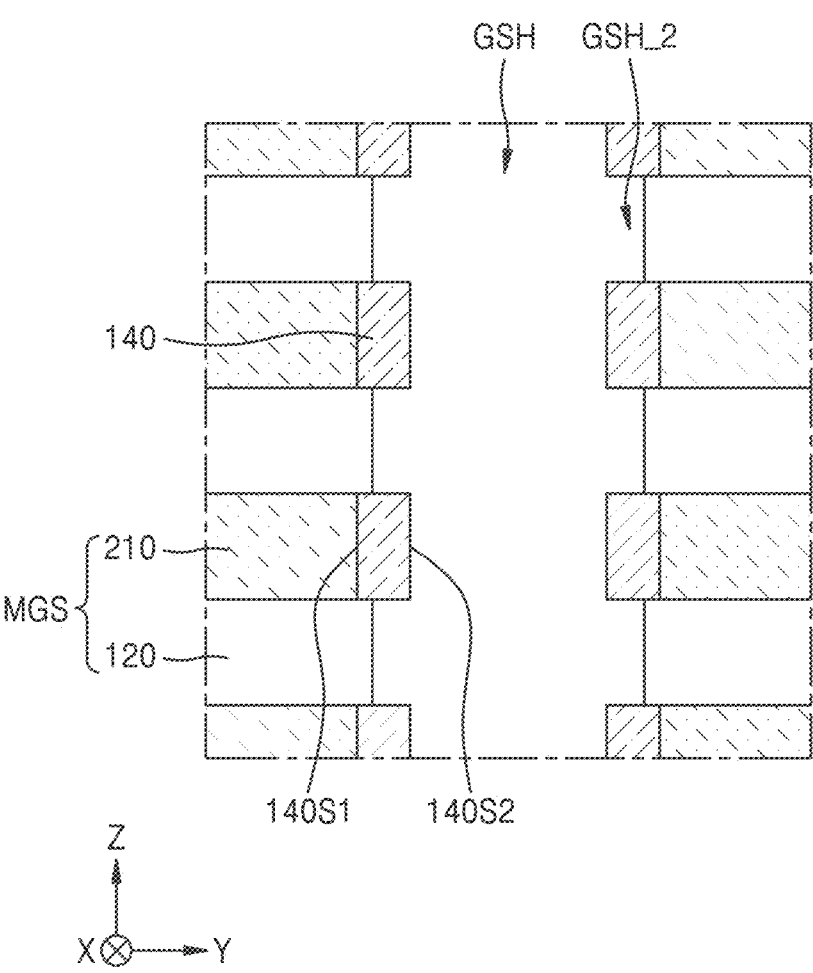

Referring to FIG. 17, a recessing process for laterally removing the insulation layer 120 exposed on the inner wall of the through hole GSH may be performed, thereby forming an extended space GSH_2 extending from the through hole GSH in lateral directions.

According to various example embodiments, the recessing process may be performed by using an etching process using an etchant having an etch selectivity with respect to a material constituting the insulation layer 120, and, during the recessing process, the channel portions 140 may be hardly etched. The top surfaces and the bottom surfaces of the channel portions 140 may be exposed by the extended space GSH_2.

Figure 18:
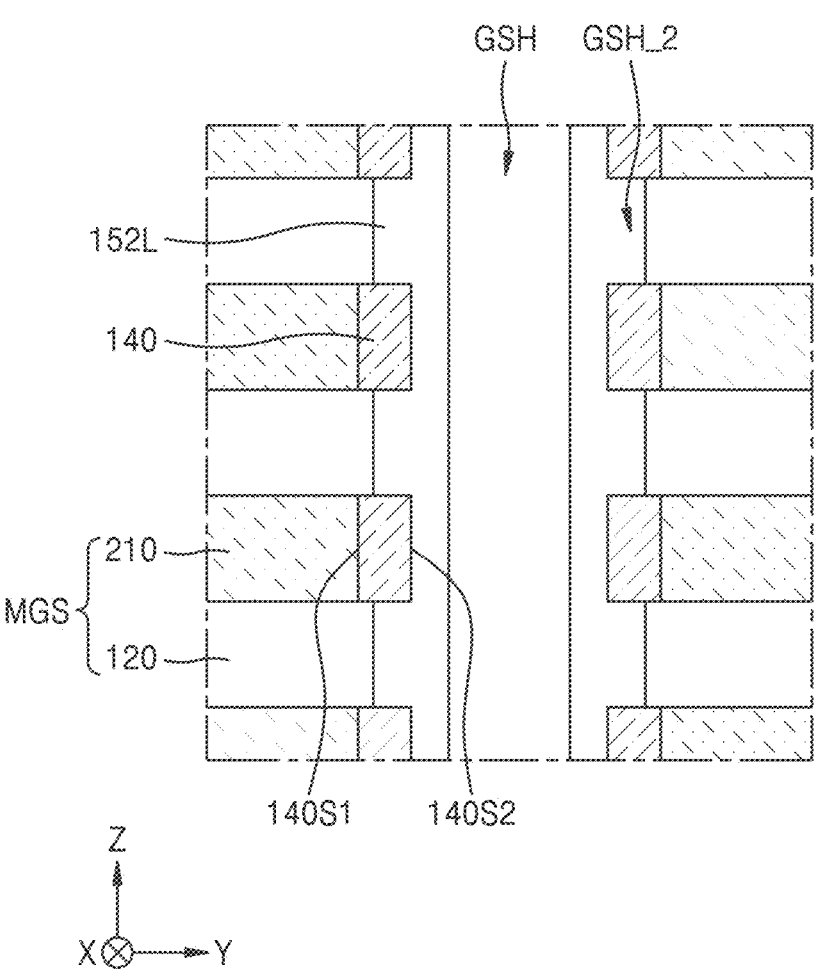

Referring to FIG. 18, a spacer layer 152L may be conformally formed on the inner wall of the through hole GSH to a sufficient thickness to completely fill the extended space GSH_2. The spacer layer 152L may be disposed to cover the inner walls 140S2 of the channel portions 140 and sidewalls of the insulation layers 120.

According to various example embodiments, the spacer layer 152L may be formed through one or more of a CVD process, an ALD process, etc. by using silicon nitride.

Figure 19:
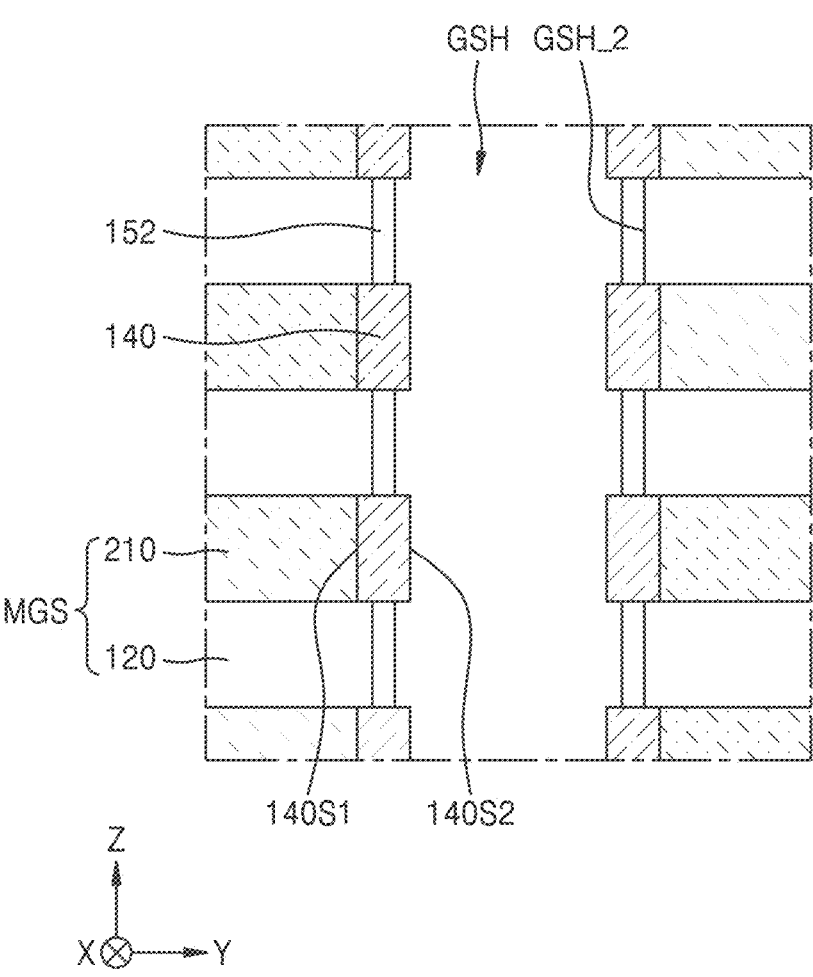

Referring to FIG. 19, the spacers 152 may be formed in the extended space GSH_2 by removing portions of the spacer layer 152L disposed inside the through hole GSH.

According to various example embodiments, a process for removing portions of the spacer layer 152L may be a wet etching process using an etchant containing phosphoric acid. In the process for removing portions of the spacer layer 152L, the inner walls 140S2 of the channel portions 140 may be exposed again on the inner wall of the through hole GSH.

Figure 20:
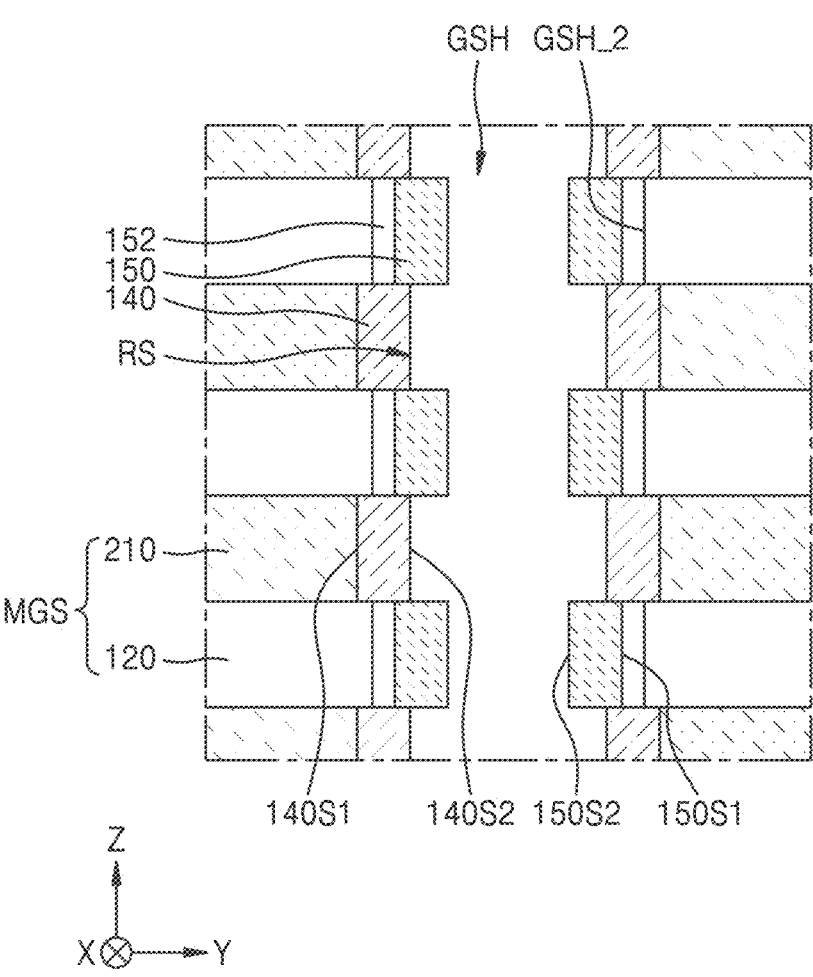

Referring to FIG. 20, the conductive layers 150 may be formed on the spacers 152. The conductive layers 150 may be formed through one or more of a CVD process, an ALD process, etc. by using a metal and/or a metal nitride.

According to various example embodiments, a metal film or a metal nitride film filling the inside of the extended space GSH_2 may be formed through a formation process having a condition in which selective deposition may be performed on surfaces of the spacers 152 with respect to surfaces of the channel portions 140, thereby forming the conductive layers 150.

According to various example embodiments, the conductive layers 150 may have a ring-like shape or an annular shape. The conductive layers 150 may each include an outer wall 150S1 and an inner wall 150S2, the inner walls 150S2 may be exposed in the through hole GSH, and the outer walls 150S1 may contact the spacers 152. The inner wall 150S2 of the conductive layers 150 may protrude toward the center of the through hole GSH with respect to the inner wall 140S2 of the channel portions 140. Therefore, the recess RS may be defined by the inner wall 140S2 of one channel portion 140 and the two conductive layers 150 disposed above and below the inner wall 140S2.

Figure 21:
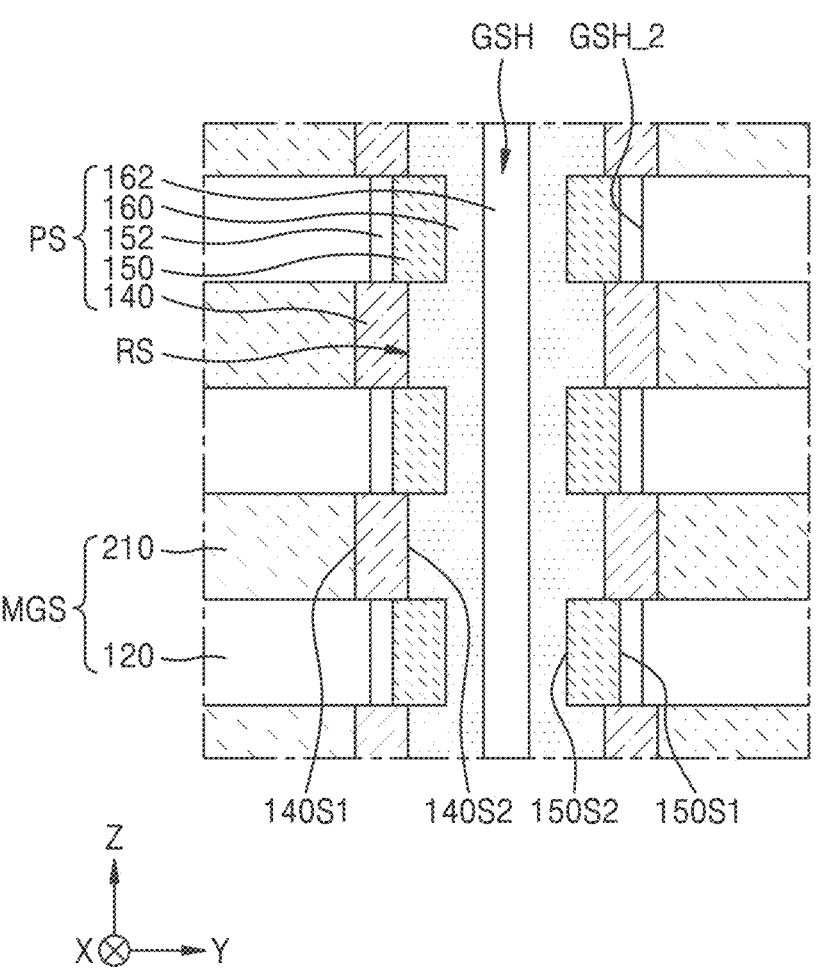

Referring to FIG. 21, the variable resistance material layer 160 may be formed on the inner wall of the through hole GSH. The variable resistance material layer 160 may be disposed to cover the inner walls 140S2 of the channel portions 140 and the inner walls 150S2 of the conductive layers 150 and fill the inside of the recesses RS.

Thereafter, the buried insulation layer 162 filling the inside of the through hole GSH may be formed on the variable resistance material layer 160. Therefore, the pillar structure PS disposed inside the through hole GSH may be formed.

Figure 22A:
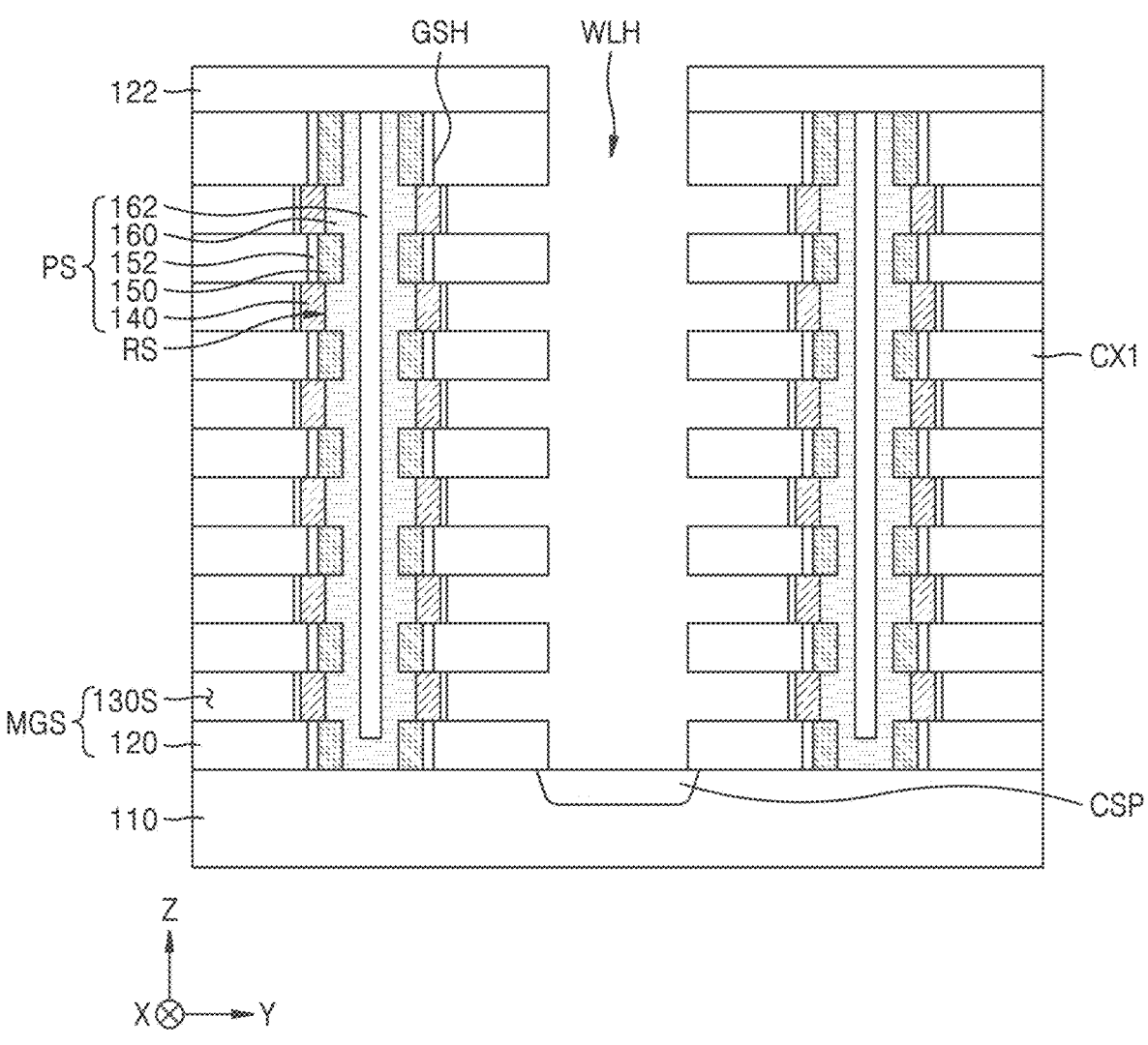
Figure 22B:
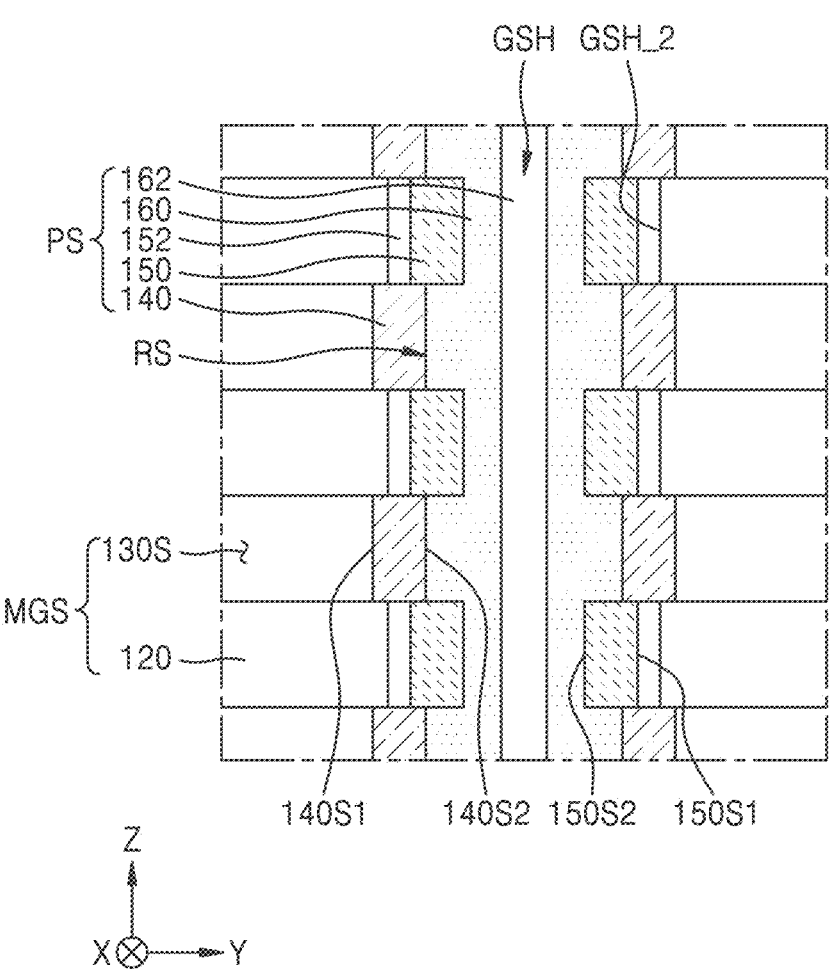

Referring to FIGS. 22A and 22B, the upper insulation layer 122 covering the topmost insulation layer 120 and the pillar structure PS may be formed. Thereafter, a portion of the mold gate stack MGS may be removed to form the gate stack separation hole WLH. The common source plate CSP may be formed by implanting an impurity into a portion of the substrate 110 exposed at the bottom of the gate stack separation hole WLH.

Thereafter, gate electrode spaces 130S may be formed by removing the sacrificial layers 210 exposed on the inner wall of the gate stack separation hole WLH. A gate electrode space 130S may be disposed between two adjacent insulation layers 120 from among the insulation layers 120, and the outer wall 140S1 of the channel portion 140 may be exposed in the gate electrode space 130S.

Referring back to FIGS. 3 and 4, the gate insulation layer 132 and the gate electrode 130 may be sequentially formed in the gate electrode space 130S. Thereafter, a separating insulation layer 170 may be formed in the gate stack separation hole WLH, the bit line plug 182, which penetrates through the upper insulation layer 122 and is connected to the pillar structure PS, may be formed, and the bit line 184 may be formed on the upper insulation layer 122.

The memory device 100 may be completed by the above-described process.

Figure 23:
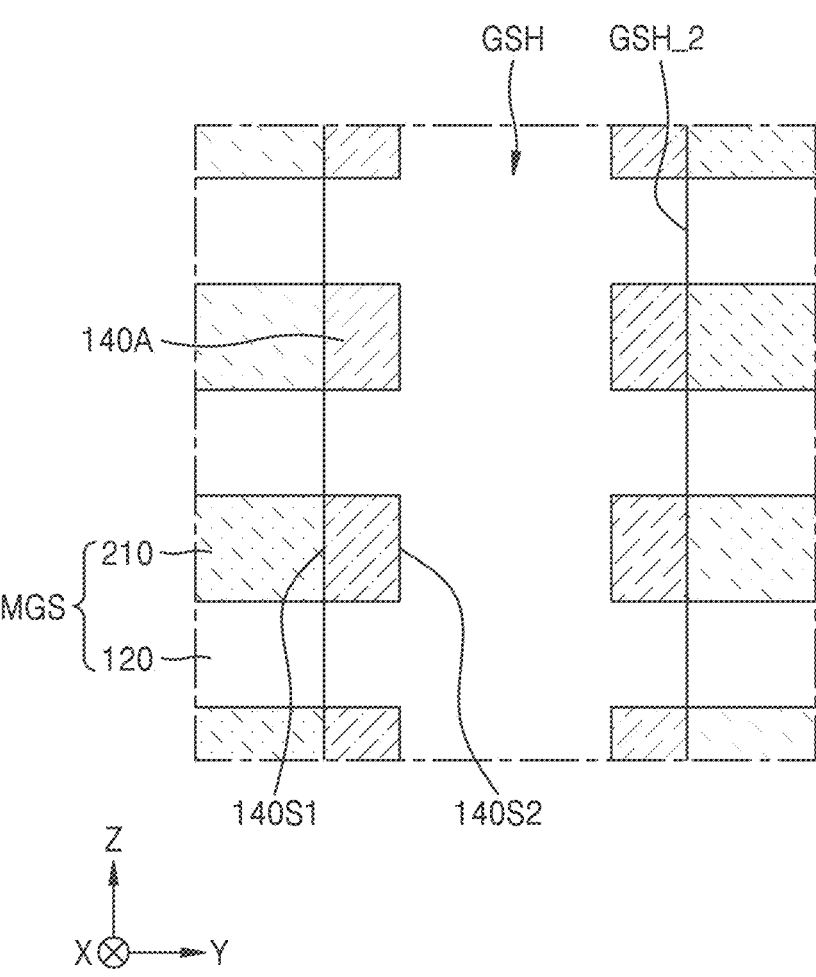
FIGS. 23 to 25 are cross-sectional views of a method of manufacturing a memory device according to various example embodiments.
Figure 24:
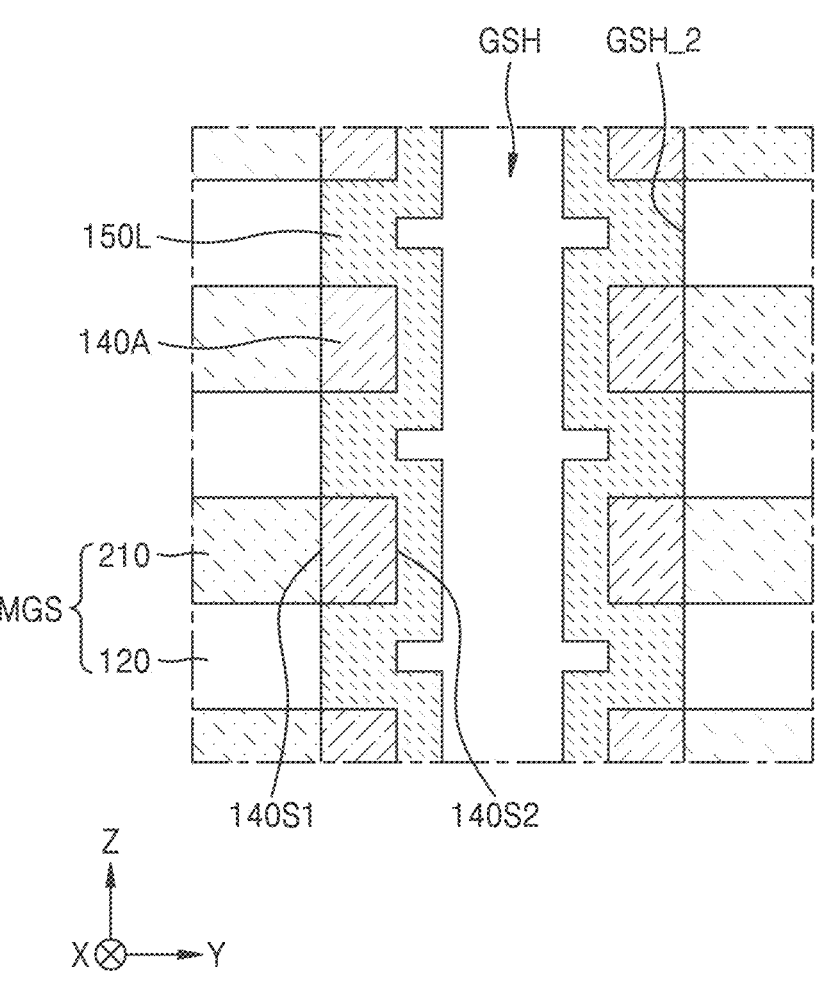
Figure 25:
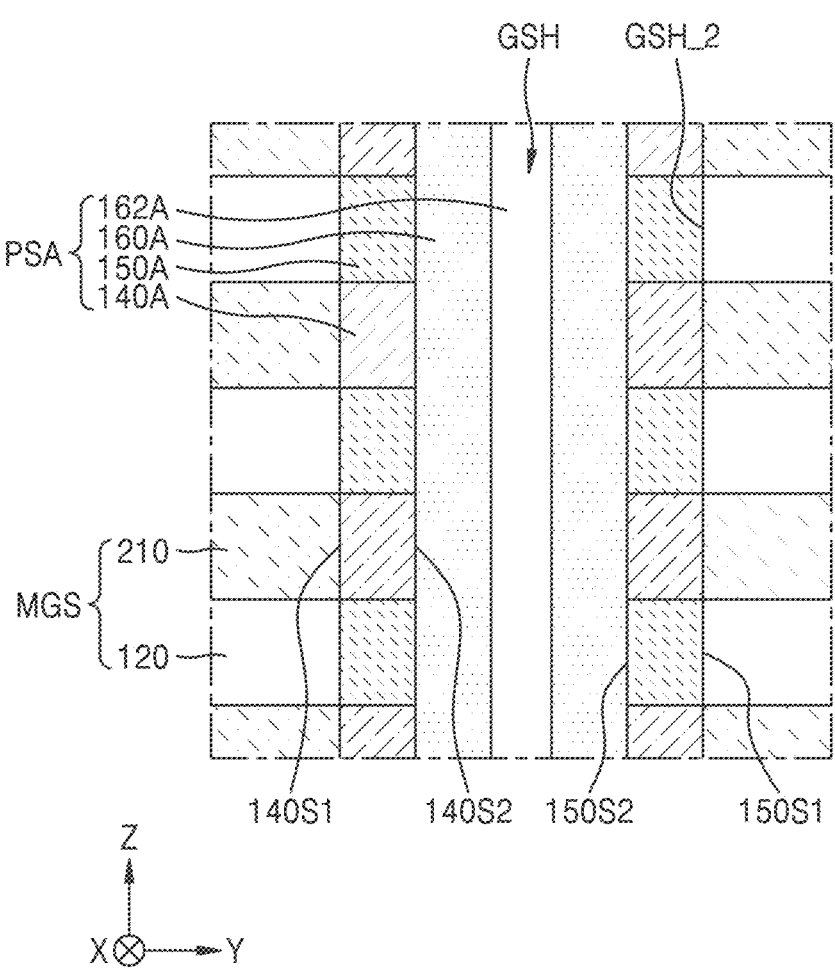

FIGS. 23 to 25 are cross-sectional views of a method of manufacturing the memory device 100A according to various example embodiments.

First, the process described above with reference to FIGS. 14A to 16 is performed.

Referring to FIG. 23, a recessing process for laterally removing the insulation layer 120 exposed on the inner wall of the through hole GSH may be performed, thereby forming the extended space GSH_2 extending from the through hole GSH in lateral directions.

According to various example embodiments, the recessing process may be performed by using an etching process using an etchant having an etch selectivity with respect to a material constituting the insulation layer 120, and, during the recessing process, the channel portions 140A may be hardly etched. The top surfaces and the bottom surfaces of the channel portions 140A may be exposed by the extended space GSH_2.

Referring to FIG. 24, a conductive layer 150L may be formed on the inner wall of the through hole GSH. The conductive layer 150L may be formed through a CVD process, an ALD process, etc. by using a metal or a metal nitride.

According to various example embodiments, the conductive layer 150L may be conformally formed on the sidewalls of the insulation layers 120 and the inner walls 140S2 of the channel portions 140A to a sufficient thickness to fill the inside of the extended space GSH_2.

Referring to FIG. 25, an anisotropic etching process (e.g., a dry etching process) may be performed inside the through hole GSH, such that a portion of the conductive layer 150L is removed and the conductive layers 150A arranged between the channel portions 140A remain.

Widths of the conductive layers 150A may be adjusted or trimmed by the anisotropic etching process, such that the inner walls 150S2 of the conductive layers 150A are aligned with the inner walls 140S2 of the channel portions 140A.

Thereafter, the variable resistance material layer 160A may be formed on the inner wall of the through hole GSH. The variable resistance material layer 160A may be formed to have substantially vertical sidewalls in contact with the inner walls 150S2 of the conductive layers 150A and the inner walls 140S2 of the channel portions 140A.

Thereafter, the process described above with reference to FIGS. 21 to 22B may be performed to complete the memory device 100A.

Figure 26:
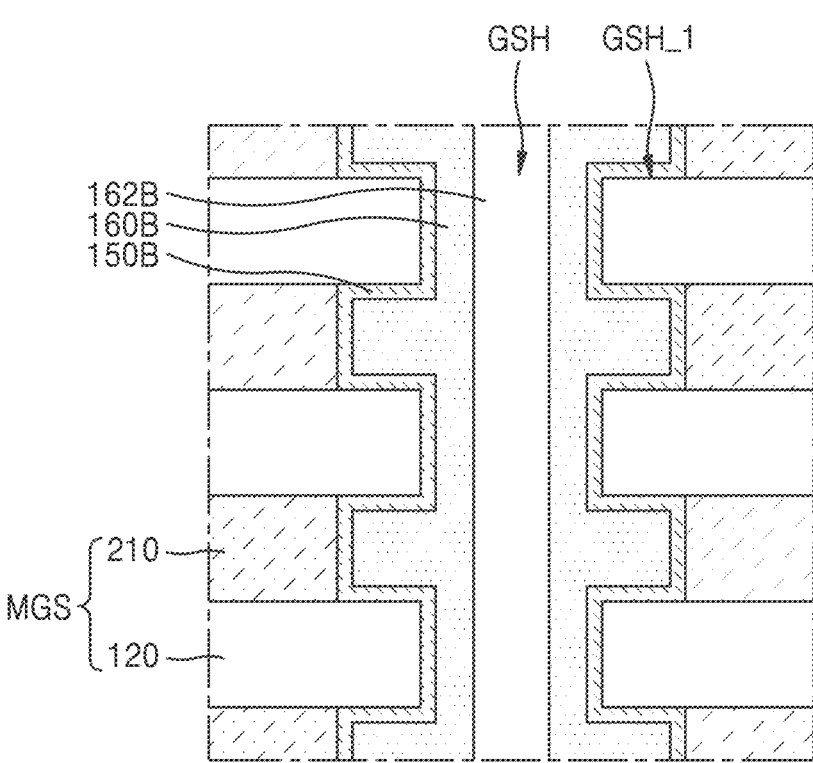
FIGS. 26 to 28 are cross-sectional views of a method of manufacturing a memory device according to various example embodiments.
Figure 26:
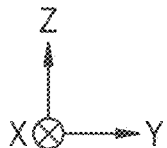
Figure 27:
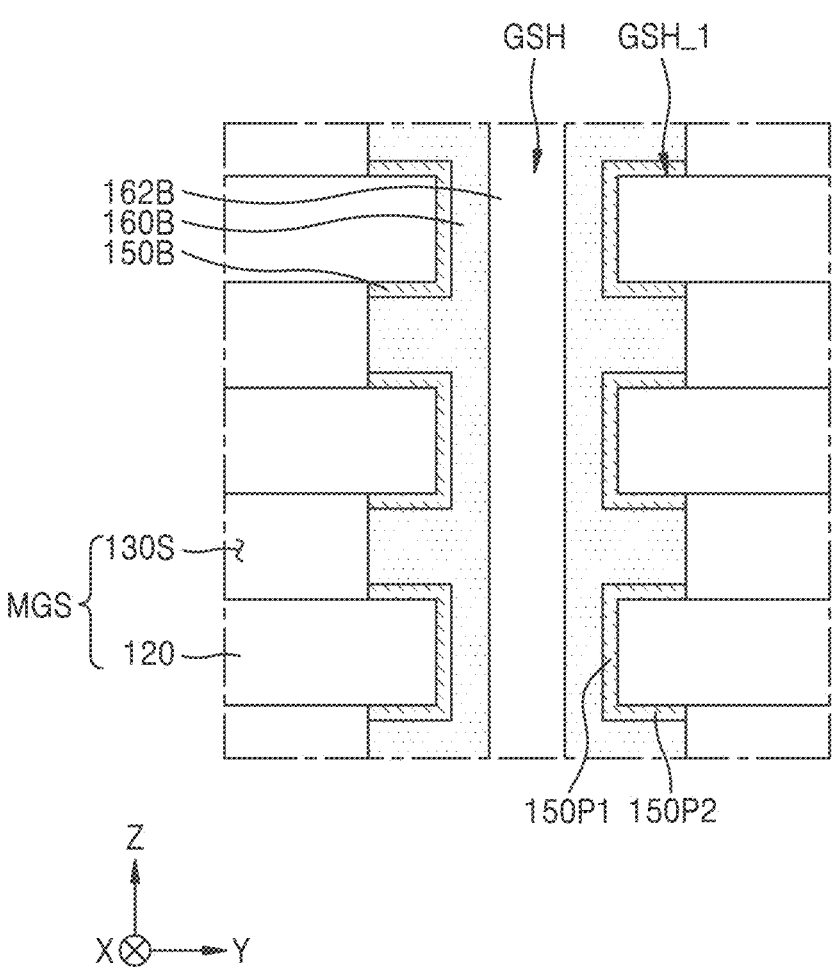
Figure 28:
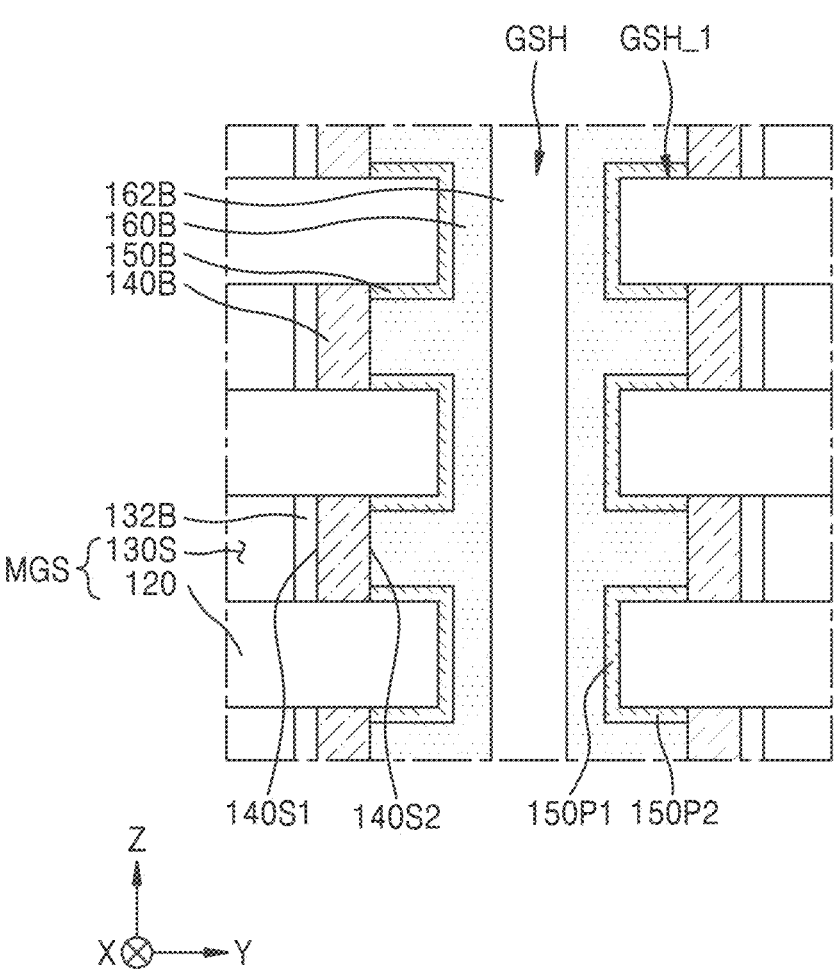

FIGS. 26 to 28 are cross-sectional views of a method of manufacturing the memory device 100B according to various example embodiments.

First, the process described above with reference to FIGS. 14A to 15 is performed.

Referring to FIG. 26, a conductive layer 150B and the variable resistance material layer 160B may be sequentially formed on the inner walls of the through hole GSH and the extended space GSH_1. The conductive layer 150B may be formed to a relatively small thickness to not to completely fill the extended space GSH_1 and the variable resistance material layer 160B may completely fill the inside of the extended space GSH_1 on the conductive layer 150B.

Thereafter, the buried insulation layer 162B filling the through hole GSH may be formed on the variable resistance material layer 160B.

Referring to FIG. 27, a gate stack separation hole WLH (refer to FIG. 12) may be formed by removing a portion of the mold gate stack MGS, and a plurality of gate electrode spaces 130S may be formed by removing the sacrificial layers 210 exposed by the gate stack separation hole WLH.

The sidewalls of the conductive layer 150B may be exposed by the gate electrode spaces 130S.

Thereafter, the conductive layer 150B may be further removed by a certain thickness, such that the sidewalls of the variable resistance material layer 160B are exposed in the gate electrode spaces 130S. Therefore, the conductive layer 150B may be formed to include the first portion 150P1 disposed on sidewalls of each of the insulation layers 120 and the second portion 150P2 extending onto the top surface and the bottom surface of each of the insulation layers 120. As shown in FIG. 27, the conductive layer 150B may have a vertical cross-section having the shape of U rotated by 90 degrees.

Referring to FIG. 28, a conductive layer (not shown) may be formed on the inner walls of the gate electrode spaces 130S, and an etch-back process may be performed on the conductive layers, thereby forming the channel portions 140B contacting the variable resistance material layer 160B and the conductive layers 150B in the gate electrode spaces 130S.

According to various example embodiments, the channel portions 140B may have a ring-shaped or annular horizontal cross-section, the outer walls 140S1 of the channel portions 140B may be exposed in the gate electrode spaces 130S, and the inner walls 140S2 of the channel portions 140B may contact the conductive layers 150B and the variable resistance material layer 160B.

Thereafter, an oxidation process may be performed on surfaces of the outer walls 140S1 of the channel portions 140B exposed in the gate electrode spaces 130S, thereby forming a gate insulation layer 132B on the outer walls 140S1 of the channel portions 140B. The gate insulation layer 132B may include silicon oxide.

Referring back to FIGS. 12 and 13, gate electrodes 130B may be formed in the gate electrode spaces 130S.

Thereafter, the process described above with reference to FIGS. 22A and 22B may be performed to complete the memory device 100B.

Figure 29:
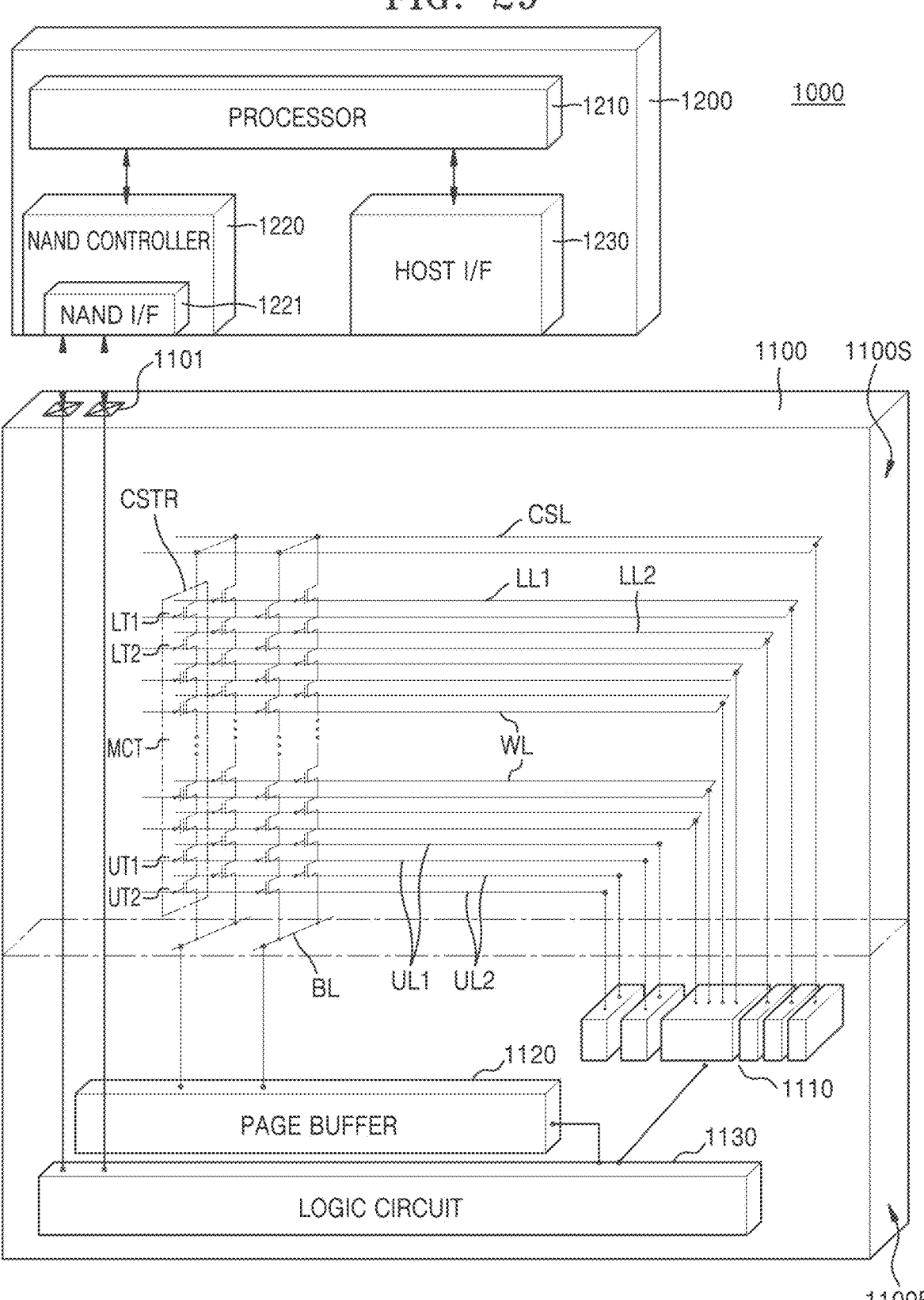
FIG. 29 is a diagram schematically showing a data storage system including a memory device according to various example embodiments.

FIG. 29 is a diagram schematically showing a data storage system 1000 including a memory device according to various example embodiments.

Referring to FIG. 29, the data storage system 1000 may include one or more memory devices 1100 and a memory controller 1200 electrically connected to the memory devices 1100. The data storage system 1000 may be, for example, a solid-state drive (SSD) device, a universal serial bus (USB), a computing system, a medical device, or a communication device including at least one memory device 1100.

The memory device 1100 may be a non-volatile memory device. For example, the memory device 1100 may be or may include a NAND flash memory device including one of memory devices 10, 100, 100A, and 100B described above with reference to FIGS. 1 to 13. The memory device 1100 may include a first structure 1100F and a second structure 1100S on the first structure 1100F. The first structure 1100F may be a peripheral circuit structure including a row decoder 1110, a page buffer 1120, and a logic circuit 1130.

The second structure 1100S may be a memory cell structure including bit lines BL, a common source line CSL, a plurality of word lines WL, first and second string select lines UL1 and UL2, first and second ground select lines LL1 and LL2, and a plurality of memory cell strings CSTR between the bit lines BL and the common source line CSL.

In the second structure 1100S, the memory cell strings CSTR may each include ground select transistors LT1 and LT2 adjacent to the common source line CSL, string select transistors UT1 and UT2 adjacent to the bit lines BL, and a plurality of memory cell transistors MCT between the ground select transistors LT1 and LT2 and the string select transistors UT1 and UT2. The number of ground select transistors LT1 and LT2 and the number of string select transistors UT1 and UT2 may be variously changed according to various example embodiments.

According to various example embodiments, the first and second ground select lines LL1 and LL2 may be connected to gate electrodes of the ground select transistors LT1 and LT2 therebelow, respectively. A word line WL may be connected to a gate electrode of a memory cell transistor MCT. The first and second string select lines UL1 and UL2 may be connected to gate electrodes of the string select transistors UT1 and UT2, respectively.

The common source line CSL, the ground select lines LL1 and LL2, the word lines WL, and the first and second string select lines UL1 and UL2 may be connected to a row decoder 1110. The bit lines BL may be electrically connected to the page buffer 1120.

The memory device 1100 may communicate with the memory controller 1200 through input/output pads 1101 electrically connected to the logic circuit 1130. The input/output pads 1101 may be electrically connected to the logic circuit 1130.

The memory controller 1200 may include a processor 1210, a NAND controller 1220, and a host interface 1230. According to some embodiments, the data storage system 1000 may include a plurality of memory devices 1100. In this case, the memory controller 1200 may control the memory devices 1100.

The processor 1210 may control the overall operation of the data storage system 1000 including the memory controller 1200. The processor 1210 may operate according to a certain firmware and may access the memory device 1100 by controlling the NAND controller 1220. The NAND controller 1220 may include a NAND interface 1221 that handles communication with the memory device 1100. Control commands for controlling the memory device 1100, data to be written to the memory cell transistors MCT of the memory device 1100, and data to be read from the memory cell transistors MCT of the memory device 1100 may be transmitted through the NAND interface 1221. The host interface 1230 may provide the function for communication between the data storage system 1000 and an external host. When a control command is received from an external host through the host interface 1230, the processor 1210 may control the memory device 1100 in response to the control command.

Figure 30:
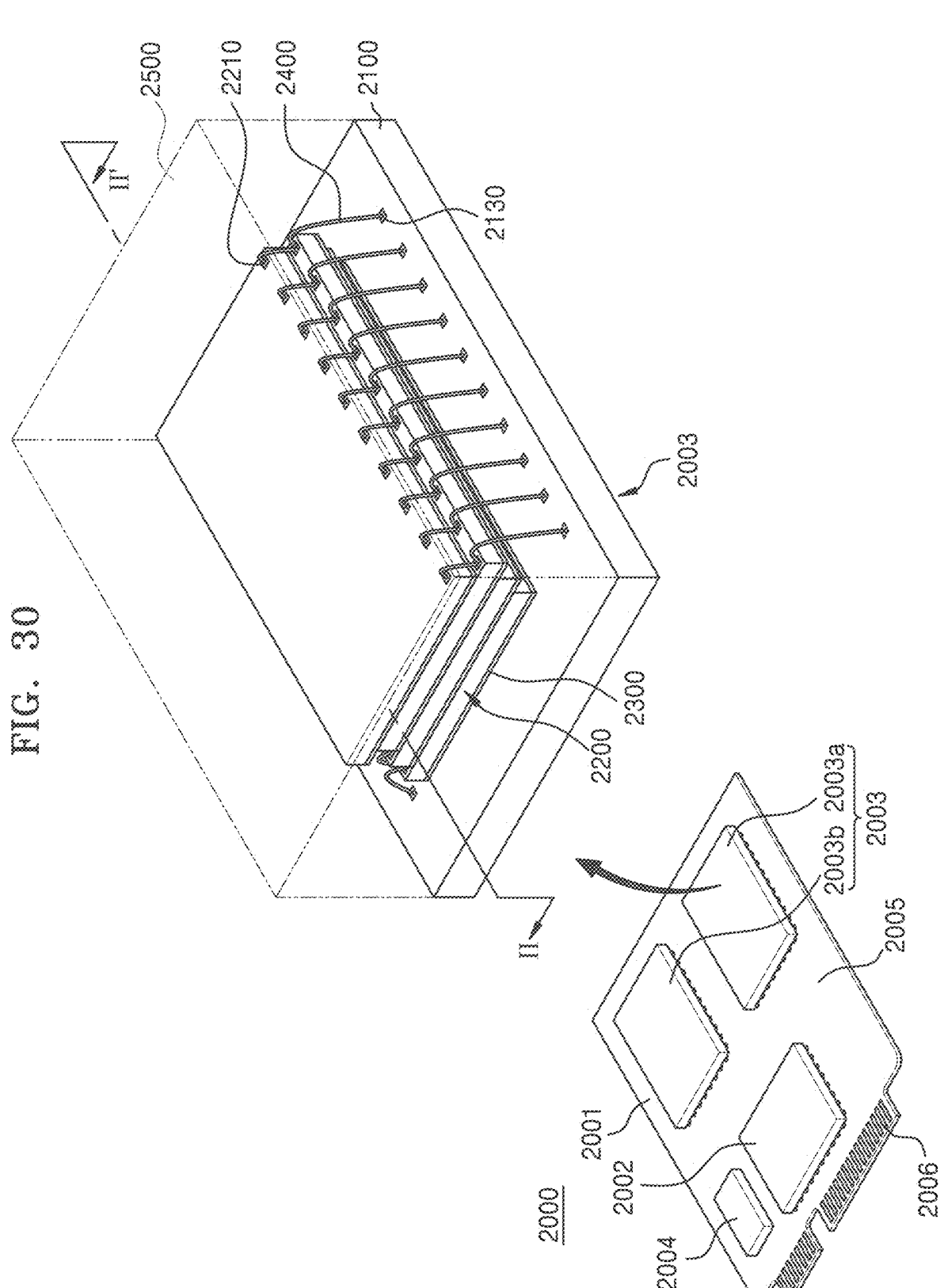
FIG. 30 is a schematic perspective view of a data storage system including a memory device according to various example embodiments.

FIG. 30 is a schematic perspective view of a data storage system 2000 including a memory device according to various example embodiments.

Referring to FIG. 30, the data storage system 2000 according to some example embodiments may include a main substrate 2001, a memory controller 2002 mounted on the main substrate 2001, one or more semiconductor packages 2003, and a DRAM 2004. The semiconductor package 2003 and the DRAM 2004 may be connected to the memory controller 2002 by a plurality of wiring patterns 2005 formed on the main substrate 2001.

The main substrate 2001 may include a connector 2006 including a plurality of pins coupled to an external host. The number and arrangement of the pins of the connector 2006 may vary according to a communication interface between the data storage system 2000 and the external host. According to various example embodiments, the data storage system 2000 may communicate with an external host according to any one or more of interfaces including a universal serial bus (USB), peripheral component interconnect express (PCI-Express), serial advanced technology attachment (SATA), M-Phy for universal flash storage (UFS), etc. According to various example embodiments, the data storage system 2000 may operate by power supplied from an external host through the connector 2006. The data storage system 2000 may further include a power management integrated circuit (PMIC) that distributes power supplied from the external host to the memory controller 2002 and the semiconductor package 2003.

The memory controller 2002 may write data to and/or read data from the semiconductor package 2003 and may improve the operating speed of the data storage system 2000.

The DRAM 2004 may be or may include a buffer memory for mitigating a speed difference between the semiconductor package 2003, which is a data storage space, and an external host. The DRAM 2004 included in the data storage system 2000 may also operate as a type of cache memory and may provide a space for temporarily storing data in a control operation for the semiconductor package 2003. When the DRAM 2004 is included in the data storage system 2000, the memory controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may each be a semiconductor package including a plurality of semiconductor chips 2200. The first and second semiconductor packages 2003a and 2003b may each include a package substrate 2100, the semiconductor chips 2200 on the package substrate 2100, an adhesive layer 2300 disposed on the bottom surface of each of the semiconductor chips 2200, a connection structure 2400 electrically connecting the semiconductor chips 2200 and the package substrate 2100, and a molding layer 2500 covering the semiconductor chips 2200 and the connection structure 2400 on the package substrate 2100.

The package substrate 2100 may be a printed circuit board including a plurality of package upper pads 2130. The semiconductor chips 2200 may each include input/output pads 2210. The input/output pad 2210 may correspond to the input/output pad 1101 of FIG. 29. The semiconductor chips 2200 may each include at least one of the memory devices 10, 100, 100A, and 100B described above with reference to FIGS. 1 to 13.

According to various example embodiments, the connection structure 2400 may be a bonding wire electrically connecting the input/output pad 2210 and the package upper pad 2130. Therefore, in the first and second semiconductor packages 2003a and 2003b, the semiconductor chips 2200 may be electrically connected to one another through bonding wires and may be electrically connected to the package upper pads 2130 of the package substrate 2100. According to various example embodiments, in the first and second semiconductor packages 2003a and 2003b, the semiconductor chips 2200 may be connected to one another through a connection structure including through silicon vias (TSVs) instead of the connection structure 2400 including bonding wires.

According to various example embodiments, the memory controller 2002 and the semiconductor chips 2200 may be included in one package. According to embodiment, the memory controller 2002 and the semiconductor chips 2200 may be mounted on a separate interposer substrate different from the main substrate 2001 and the memory controller 2002 and the semiconductor chips 2200 may be connected to each other through wires formed on the interposer substrate.

Figure 31:
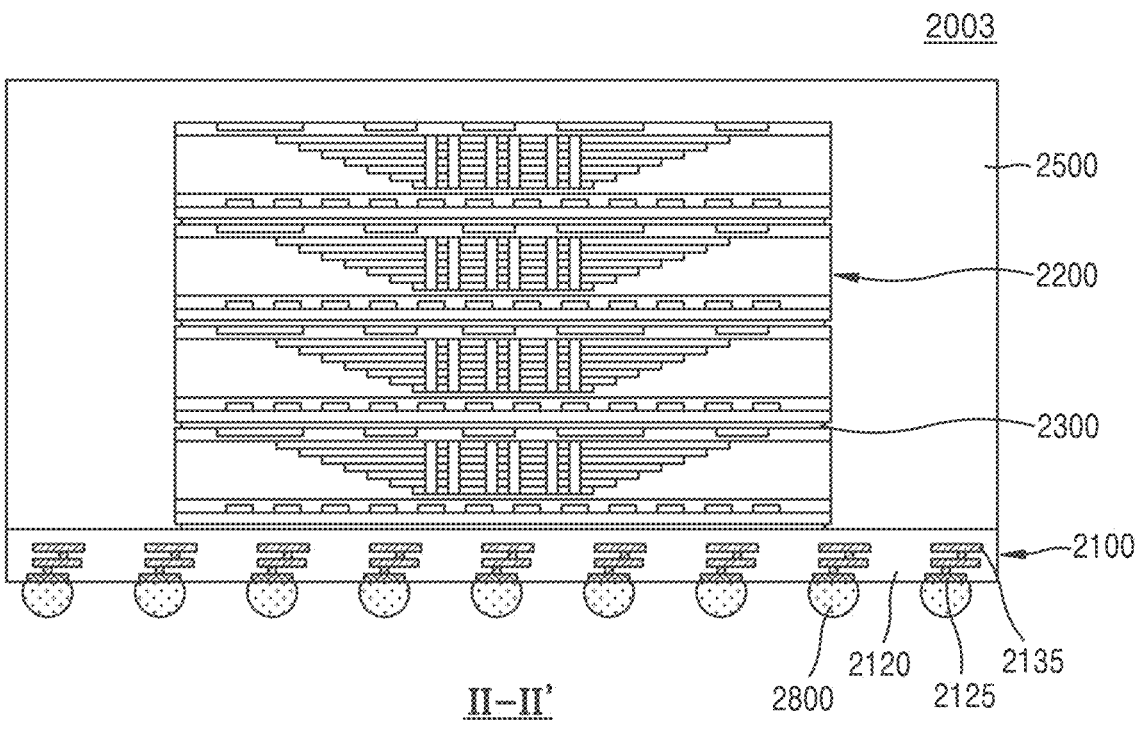
FIG. 31 is a schematic cross-sectional view of semiconductor packages according to various example embodiments.

FIG. 31 is a schematic cross-sectional view of semiconductor packages 2003 according to various example embodiments. FIG. 31 is a cross-sectional view taken along a line II-If of FIG. 30.

Referring to FIG. 31, in a semiconductor package 2003, the package substrate 2100 may be a printed circuit board. The package substrate 2100 may include a package substrate body 2120, a plurality of package upper pads 2130 (refer to FIG. 30) arranged on the top surface of the package substrate body 2120, a plurality of package lower pads 2125 arranged or exposed on the bottom surface of the package substrate body 2120, and a plurality of internal wires 2135 electrically connecting the package upper pads 2130 (refer to FIG. 30) and the package lower pads 2125 inside the package substrate body 2120. As shown in FIG. 31, the package upper pads 2130 may be electrically connected to the connection structures 2400. As shown in FIG. 31, the package lower pads 2125 may be connected to the wiring patterns 2005 on the main substrate 2001 of the data storage system 2000 shown in FIG. 30 through a plurality of conductive bumps 2800. The semiconductor chips 2200 may each include at least one of the memory devices 10, 100, 100A, and 100B described above with reference to FIGS. 1 to 13.

While inventive concepts has been particularly shown and described with reference to various example embodiments thereof, it will be understood that various changes in form and details may be made therein without departing from the spirit and scope of the following claims. Furthermore example embodiments are not necessarily mutually exclusive with one another. For example, some example embodiments may include one or more features described with reference to one or more drawings, and may also include one or more other features described with reference to one or more other drawings.

What is claimed is:

1. A memory device comprising:
a gate stack on a substrate, the gate stack comprising a plurality of insulation layers and a plurality of gate electrodes alternately stacked in a vertical direction, and defining a through hole in the vertical direction; and
a pillar structure in the through hole,
wherein the pillar structure includes,
a plurality of channel portions in the through hole to face the gate electrodes and having annular horizontal cross-sections,
a plurality of conductive layers in the through hole to face the insulation layers, having annular horizontal cross-sections, and having inner walls protruding toward a center of the through hole with respect to inner walls of the channel portions, and
a variable resistance material layer in the through hole on the inner walls of the channel portions and the inner walls of the conductive layers, wherein
a first portion of the variable resistance material layer overlaps the conductive layers in the vertical direction.

2. The memory device of claim 1, wherein
the inner walls of the channel portions and top surfaces of and bottom surfaces of the conductive layers define a plurality of recesses, and
the first portion of the variable resistance material layer is in the plurality of recesses.

3. The memory device of claim 2, wherein in the plurality of recesses the first portion of the variable resistance material layer contacts the top surfaces of and the bottom surfaces of the conductive layers and the inner walls of the channel portions.

4. The memory device of claim 1, wherein
the gate stack further comprises a gate insulation layer covering top surfaces of and bottom surfaces of the gate electrodes, and
the gate insulation layer is between each of the gate electrodes and each of the corresponding channel portions.

5. The memory device of claim 1, wherein
the pillar structure further comprises spacers between the insulation layers and the conductive layers, and
top surfaces of and/or bottom surfaces of the spacers contact the channel portions.

6. A memory device comprising:
a gate stack on a substrate, comprising a plurality of insulation layers and a plurality of gate electrodes that are alternately stacked in a vertical direction, and defining a through hole in the vertical direction;
a plurality of channel portions in the through hole to face the gate electrodes;
a plurality of conductive layers in the through hole to face the insulation layers; and
a variable resistance material layer on first sidewalls of the channel portions and second sidewalls of the conductive layers, the variable resistance material layer in the through hole, and extending in the vertical direction, wherein
a bottom surface of at least one of the plurality of conductive layers contacts with a top surface of at least one of the plurality of channel portions.

7. The memory device of claim 6, wherein each of the channel portions has an annular horizontal cross-sectional shape, and the channel portions are spaced apart from one another in the vertical direction.

8. The memory device of claim 6, wherein
the second sidewalls of the conductive layers protrude from the first sidewalls of the channel portions toward an inside of the through hole,
the first sidewalls of the channel portions and top surfaces and bottom surfaces of the conductive layers define a plurality of recesses, and
a first portion of the variable resistance material layer is in at least one of the plurality of recesses.

9. The memory device of claim 8, wherein the variable resistance material layer contacts the top surfaces of and the bottom surfaces of the conductive layers and the first sidewalls of the channel portions, in the at least one of the plurality of recesses.

10. The memory device of claim 8, wherein the first portion of the variable resistance material layer overlaps portions of the conductive layers in the vertical direction.

11. The memory device of claim 8, further comprising:
spacers between the insulation layers and the conductive layers,
wherein at least one of top surfaces or bottom surfaces of the spacers contact the channel portions.

12. The memory device of claim 6, wherein
the second sidewalls of the conductive layers align with the first sidewalls of the channel portions, and
the variable resistance material layer has vertically extending sidewalls.

13. The memory device of claim 12, wherein the conductive layers overlap the channel portions in the vertical direction.

14. The memory device of claim 6, wherein the gate stack further comprises a gate insulation layer covering top surfaces of and bottom surfaces of the gate electrodes, and the gate insulation layer is between each of the gate electrodes and each of the corresponding channel portions.

15. The memory device of claim 6, wherein the through hole comprises an extended space extending in lateral directions toward the gate electrodes, the conductive layers extend from third sidewalls of the corresponding insulation layers onto top surfaces of and bottom surfaces of the insulation layers inside the extended space, respectively, and a first portion of the variable resistance material layer is in the extended space.

16. The memory device of claim 15, wherein the variable resistance material layer contacts the top surfaces of and the bottom surfaces of the conductive layers, in the extended space.

17. The memory device of claim 16, wherein the first portion of the variable resistance material layer, portions of the conductive layers, and portions of the insulation layers overlap one another in the vertical direction.

18. The memory device of claim 15, wherein the gate stack further comprises a gate insulation layer between the gate electrodes and the channel portions, and the gate insulation layer is not between the gate electrodes and the insulation layers.

19. A memory device comprising:

a gate stack on a substrate, comprising a plurality of insulation layers and a plurality of gate electrodes alternately stacked in a vertical direction, and defining a through hole extending in the vertical direction;

a pillar structure in the through hole and comprising, a plurality of channel portions in the through hole to face the gate electrodes, a plurality of conductive layers in the through hole, in the vertical direction alternately with the channel portions, and comprising at least one of a metal or a metal nitride, and a variable resistance material layer on inner walls of the channel portions and inner walls of the conductive layers, in the through hole;

the memory device further comprising a bit line plug on a top surface of the pillar structure; and a bit line disposed on the bit line plug.

20. The memory device of claim 19, wherein the inner walls of the channel portions and top surfaces and bottom surfaces of the conductive layers define a plurality of recesses, and a first portion of the variable resistance material layer is in the plurality of recesses.

* * * * *